US010088293B2

(12) United States Patent
Nishiwaki et al.

(10) Patent No.: US 10,088,293 B2
(45) Date of Patent: Oct. 2, 2018

(54) LIGHT DETECTION DEVICE INCLUDING LIGHT DETECTOR, LIGHT COUPLING LAYER, AND LIGHT SHIELDING FILM, AND LIGHT DETECTION SYSTEM INCLUDING SAME

(71) Applicant: Panasonic Intellectual Property Management Co., Ltd., Osaka (JP)

(72) Inventors: Seiji Nishiwaki, Hyogo (JP); Kenji Narumi, Osaka (JP); Teruhiro Shiono, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 22 days.

(21) Appl. No.: 15/459,024

(22) Filed: Mar. 15, 2017

(65) Prior Publication Data

US 2017/0284789 A1    Oct. 5, 2017

(30) Foreign Application Priority Data

Mar. 30, 2016 (JP) ................. 2016-067839

(51) Int. Cl.
*G01J 1/04* (2006.01)
*G01B 9/02* (2006.01)

(52) U.S. Cl.
CPC ..... *G01B 9/02041* (2013.01); *G01B 9/02087* (2013.01); *G01J 1/0411* (2013.01);
(Continued)

(58) Field of Classification Search
CPC ..... G01N 21/4788; G02B 6/123; G02B 6/124
See application file for complete search history.

(56) References Cited

U.S. PATENT DOCUMENTS 5,479,260 A    12/1995 Fattinger
9,739,702 B2 *  8/2017 Bringoltz ............... G01N 21/01
(Continued)

FOREIGN PATENT DOCUMENTS

JP    6-300683    10/1994
JP    11-505023    5/1999
(Continued)

OTHER PUBLICATIONS

Seiji Nishiwaki, U.S. Appl. No. 15/171,817, filed Jun. 2, 2016, entitled "Light Detection Device Including Light Detector, Light Coupling Layer, and Light Shielding Film, Light Detection System, and Optical Device".

(Continued)

*Primary Examiner* — Tony Ko
(74) *Attorney, Agent, or Firm* — McDermott Will & Emery LLP

(57) ABSTRACT

A light detection device includes a light detector including first detectors and second detectors both disposed along a main surface; a light coupling layer disposed on or above the light detector; and a light shielding film disposed on the light coupling layer. The light coupling layer includes a first low-refractive-index layer, a first high-refractive-index layer that is disposed on the first low-refractive-index layer and includes a first grating, and a second low-refractive-index layer that is disposed on the first high-refractive-index layer. The light shielding film includes a light transmitting region and a light shielding region adjacent to the light transmitting region. The light transmitting region faces two or more first detectors included in the first detectors, and the light shielding region faces two or more second detectors included in the second detectors.

12 Claims, 18 Drawing Sheets

(52) U.S. Cl.
CPC ............ *G01J 1/0422* (2013.01); *G01J 1/0437* (2013.01); *G01B 2290/30* (2013.01)

(56) References Cited

U.S. PATENT DOCUMENTS

2013/0264470 A1    10/2013  Nishiwaki
2015/0168651 A1*   6/2015   Nishiwaki ............ G02B 5/1842
                                                         250/237 R

FOREIGN PATENT DOCUMENTS

WO    1997/012225    4/1997
WO    2012/046414    4/2012

OTHER PUBLICATIONS

Max Born et al., "Principles of Optics", Tokai University Press, Dec. 20, 1980, pp. 478-485.
Goro Nishimura, "Prospects for Near Infrared Spectroscopy—Possibilities of 1 μm Wavelength Region", The 14th Meeting of Japanese Society for Medical Near Infrared Spectroscopy, vol. 49, Jul. 24, 2009, pp. 139-145.

* cited by examiner

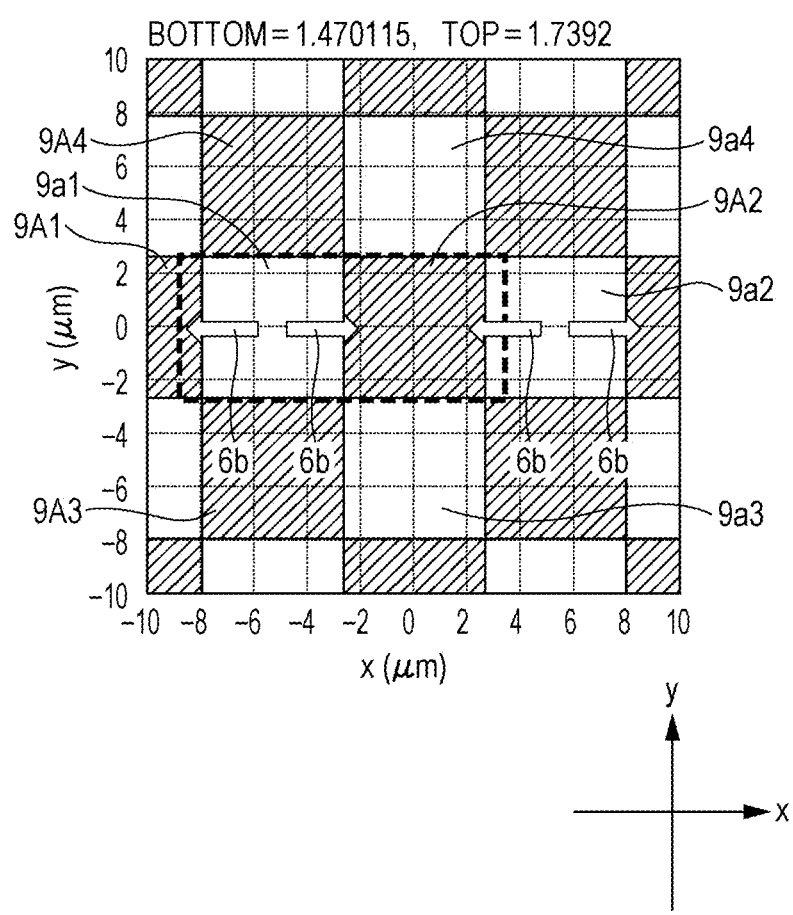

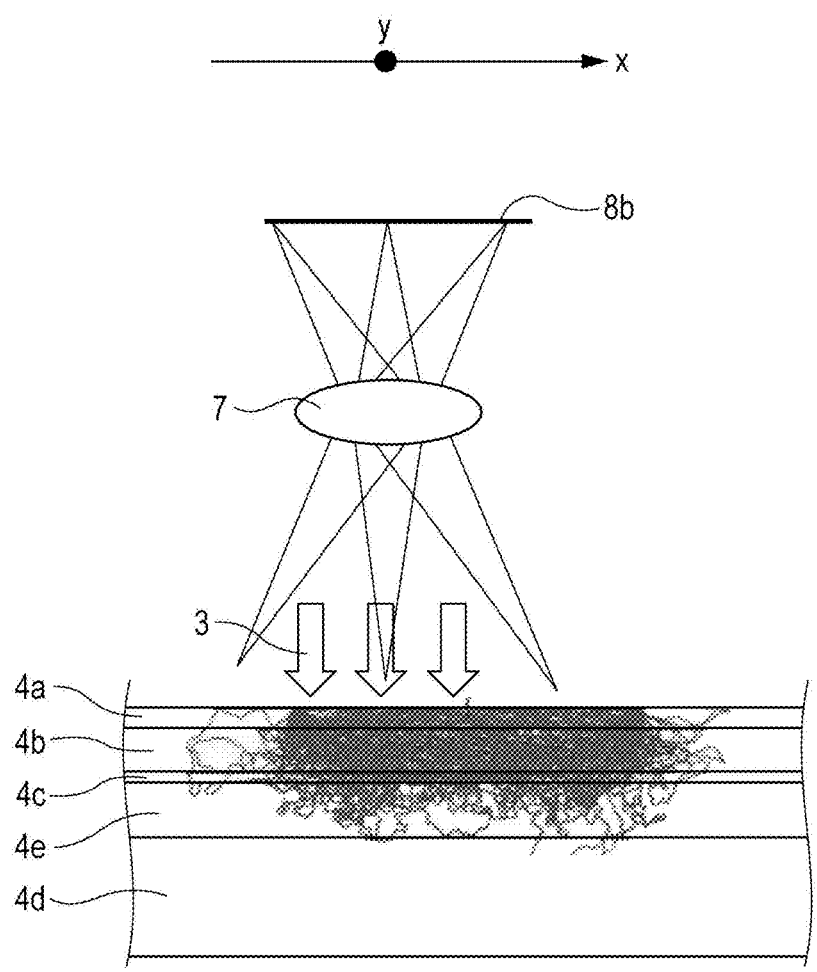

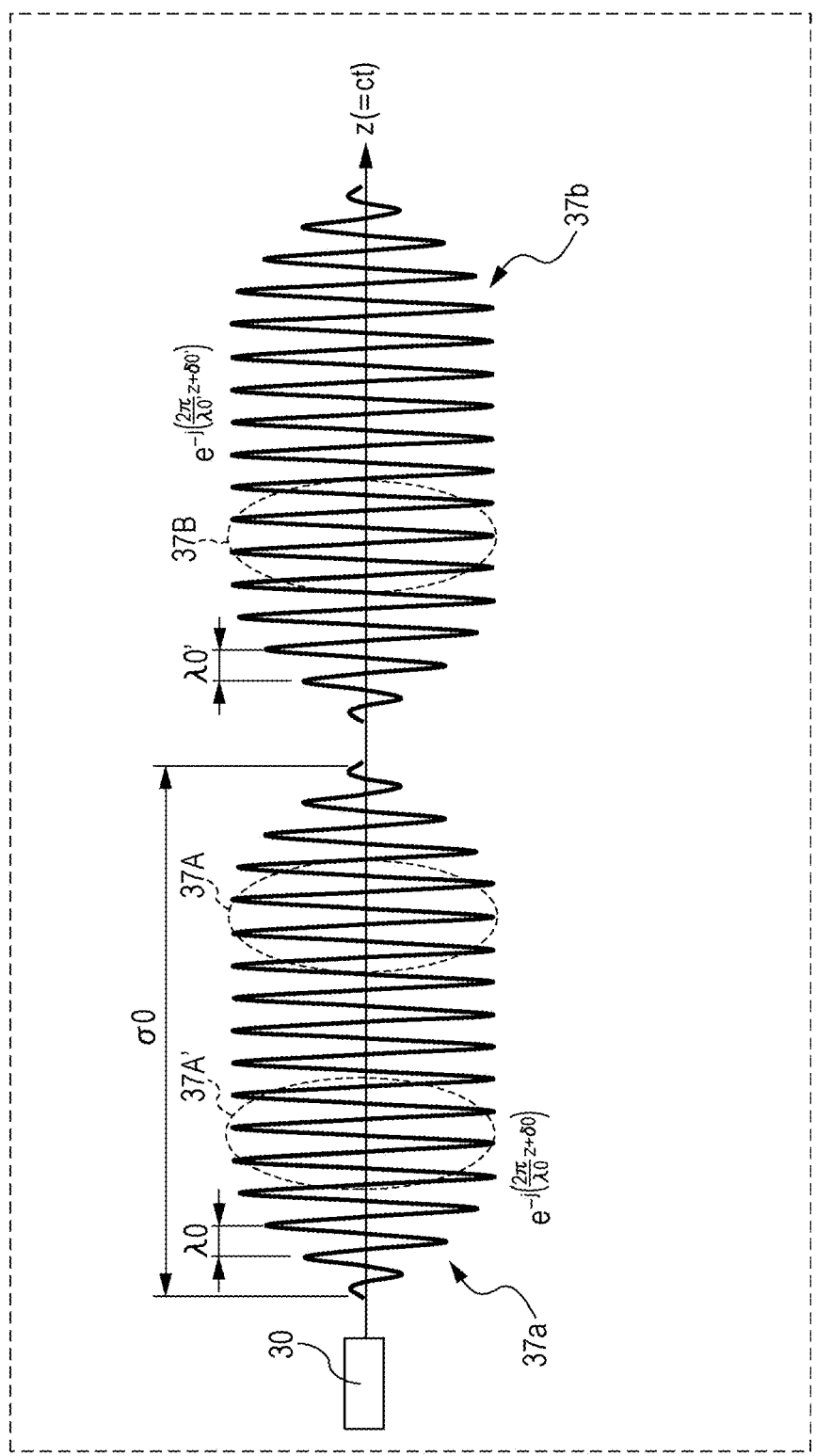

LIGHT DETECTION DEVICE INCLUDING LIGHT DETECTOR, LIGHT COUPLING LAYER, AND LIGHT SHIELDING FILM, AND LIGHT DETECTION SYSTEM INCLUDING SAME

BACKGROUND

1. Technical Field

The present disclosure relates to a light detection device, a light detection system, a light detection method, and the like.

2. Description of the Related Art

Light is an electromagnetic wave and is characterized not only by wavelength and intensity, but also by properties such as polarization and coherence. An example of a method for measuring a subject by utilizing coherence of light among these properties is a Michelson interferometer described in "Principles of Optics" (TOKAI UNIVERSITY PRESS, p. 482, M. Born, et al.).

SUMMARY

In one general aspect, the techniques disclosed here feature a light detection device including: a light detector that has a main surface and includes first detectors and second detectors that are both disposed along the main surface; a light coupling layer disposed on or above the light detector; and a light shielding film that is disposed on the light coupling layer. The light coupling layer includes a first low-refractive-index layer, a first high-refractive-index layer that is disposed on the first low-refractive-index layer and includes a first grating, and a second low-refractive-index layer that is disposed on the first high-refractive-index layer. The first high-refractive-index layer has a higher refractive index than the first low-refractive-index layer and the second low-refractive-index layer. The light shielding film includes a light transmitting region and a light shielding region adjacent to the light transmitting region. The light transmitting region faces two or more first detectors included in the first detectors. The light shielding region faces two or more second detectors included in the second detectors.

It should be noted that general or specific embodiments may be implemented as a system, a method, an integrated circuit, a computer program, a storage medium, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 2B is a plan view illustrating a plane parallel with the xy plane that includes a light shielding film of the light detection device in the examined example;

FIG. 7A illustrates overall optical arrangement in the analysis in the examined example;

FIG. 10 is a conceptual diagram illustrating light at a time t0 that is emitted from a light source and propagates in a z direction;

DETAILED DESCRIPTION

A result of detailed study on a conventional method for measuring coherence or a phase of light is described below before description of the embodiments of the present disclosure.

Figure 9A:
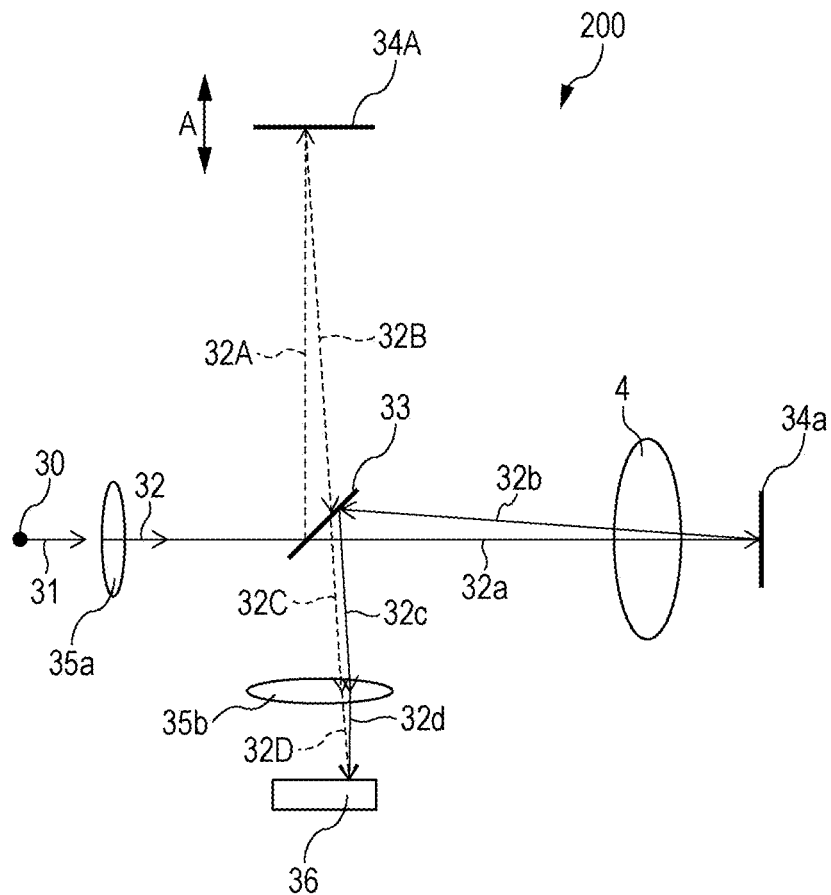
FIG. 9A is a diagram schematically illustrating a Michelson interferometer that is a first conventional example.
Figure 9B:
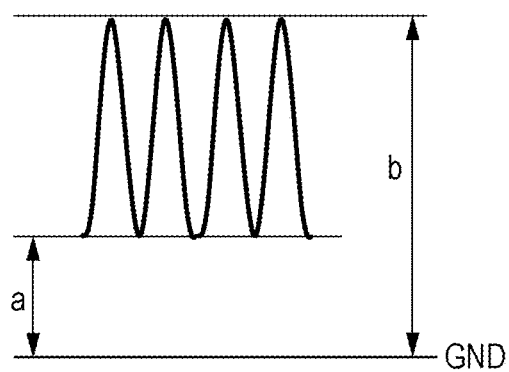
FIG. 9B is a diagram for explaining a method for evaluating coherence or a phase of light by using the interferometer.

FIG. 9A is a diagram schematically illustrating a Michelson interferometer 200, which is a first conventional example. FIG. 9B is a diagram for explaining a method for evaluating coherence or a phase of light by using the interferometer 200. As illustrated in FIG. 9A, light 31 emitted from a light source 30 is collected by a first light collecting lens 35a and thus turns into parallel light 32. Part of the parallel light 32 passes through a half mirror 33a and travels toward a first reflection mirror 34a (light 32a), is reflected by the reflection mirror 34a and travels toward the half mirror 33 (light 32b), is reflected by the half mirror 33a and travels toward a second light collecting lens 35b (light 32c), and then enters a light detector 36 located on a focal plane of the light collecting lens 35b (light 32d). Meanwhile, another part of the parallel light 32 is reflected by the half mirror 33a and travels toward a second reflection mirror 34A (light 32A), is reflected by the reflection mirror 34A and travels toward the half mirror 33 (light 32B), passes through the half mirror 33a and travels toward the light collecting lens 35b (light 32C), and then enters the light detector 36 so as to overlap the light 32d (light 32D). The light detector 36 detects light obtained by interference between the light 32d and the light 32D. The second reflection mirror 34A is configured so that a position thereof changes along a direction (arrow A) normal to a reflection surface. A relative phase of the light 32D relative to the light 32d hanges as the second reflection mirror 34A is displaced.

FIG. 9B illustrates an example of an electric signal detected by the light detector 36. In FIG. 9B, the vertical axis represents the intensity of the signal detected by the light detector 36, and the horizontal axis represents time. As illustrated in FIG. 9B, the intensity of the signal changes in a range from a to b over passage of time (i.e., as the reflection mirror 34A is displaced). A value of (b−a)/(b+a) is called contrast in interference, and the degree of coherence of the light 31 is defined by this value. The value of contrast changes as the second reflection mirror 34A is displaced in an optical axis direction.

The same principle holds even in a case where the reflection mirror 34A is fixed and a transparent subject 4 is displaced between the half mirror 33 and the reflection mirror 34a. An intensity difference corresponding to the shape of a subject appears as a spatial distribution in the intensity of the signal detected by the light detector 36. That is, an interference pattern is formed. By measuring the shape or interval of the interference pattern, the shape (phase information) of the subject can be measured.

FIG. 10 is a diagram for explaining a light interference phenomenon. FIG. 10 is a conceptual diagram illustrating light at a time t0 that is emitted from the light source 30 and propagates in a z direction. As illustrated in FIG. 10, for example, wave trains 37a and 37b are sequentially emitted from the light source 30. The length σ0 of each wave train is called a coherence length. Waves in each wave train are continuous and have a uniform wavelength. There is no correlation in phase between difference wave trains (the phase of the wave train 37a is δ0, and the phase of the wave train 37b is δ0' (δ0≠δ0')), and wavelengths in different wave trains are sometimes different from each other (the wavelength of the wave train 37a is λ0, and the wavelength of the wave train 37b is λ0' (λ0≠λ0')). For example, assume that in the optical system illustrated in FIG. 9A, interference is caused between a part 37A and a part 37A' of the wave train 37a illustrated in FIG. 10 by adjusting displacement of the second reflection mirror 34A. The waves in the part 37A and the waves in the part 37A' have equal wavelengths, and a phase difference between the part 37A and the part 37A' is stable over time (kept at a certain value). Accordingly, brightness of light after interference (the amplitude of interference light) is stable over time (kept at certain brightness). That is, the interference light looks bright or looks dark in accordance with the amount of phase difference (displacement of the reflection mirror 34A) (this state is called a coherent state). Next, assume that interference is caused between the part 37A of the wave train 37a and a part 37B of the wave train 37b. In this case, there is no guarantee that the waves in the part 37A and the waves in the part 37B have equal wavelengths, and a phase difference between the waves in the part 37A and the waves in the part 37B randomly changes over time. Accordingly, brightness of light after interference (the amplitude of interference light) randomly changes over time. This change occurs at a femtosecond time scale. Accordingly, the interference light alternates between bright and dark states at a high rate, and appear to human eyes as average brightness (this state is called an incoherent state). Laser light, which has a long wave train and has a coherence length of approximately several mm to several hundred m, is a representative of coherent light. Meanwhile, solar light, which has a short wave train and has a coherent length of approximately 1 μm (see description concerning FIGS. 11A through 11E that will be described later), is a representative of incoherent light. In a case where interference of light, such as laser light, that has a long coherent length is caused in the configuration illustrated in FIG. 9A, the probability of interference within the same wave train is high and the contrast improves (i.e., the value of contrast becomes close to 1). Meanwhile, in the case of light, such as solar light, that has a short coherence length, the probability of interference between different wave trains is high and the contrast decreases (i.e., the value of contrast becomes close to 0).

Figure 11A:
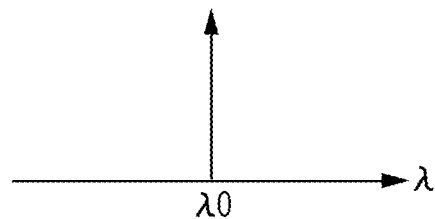
FIG. 11A is a first diagram for explaining a relationship between expanse of a wavelength of light (longitudinal mode width) from the wavelength $\lambda 0$ and a coherence length.
Figure 11B:
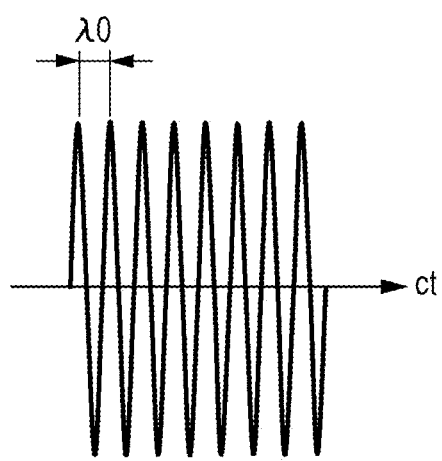
FIG. 11B is a second diagram for explaining a relationship between expanse of a wavelength of light (longitudinal mode width) from the wavelength $\lambda 0$ and a coherence length.
Figure 11C:
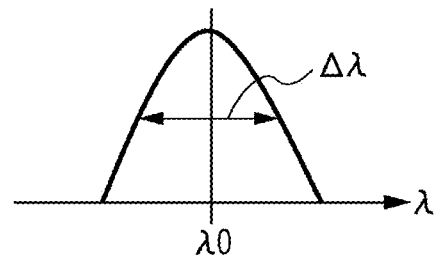
FIG. 11C is a third diagram for explaining a relationship between expanse of a wavelength of light (longitudinal mode width) from the wavelength $\lambda 0$ and a coherence length.
Figure 11D:
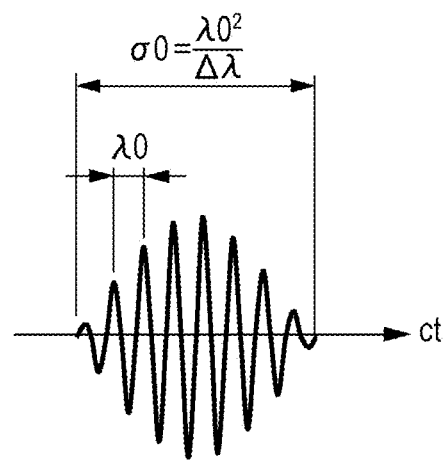
FIG. 11D is a fourth diagram for explaining a relationship between expanse of a wavelength of light (longitudinal mode width) from the wavelength $\lambda 0$ and a coherence length.
Figure 11E:
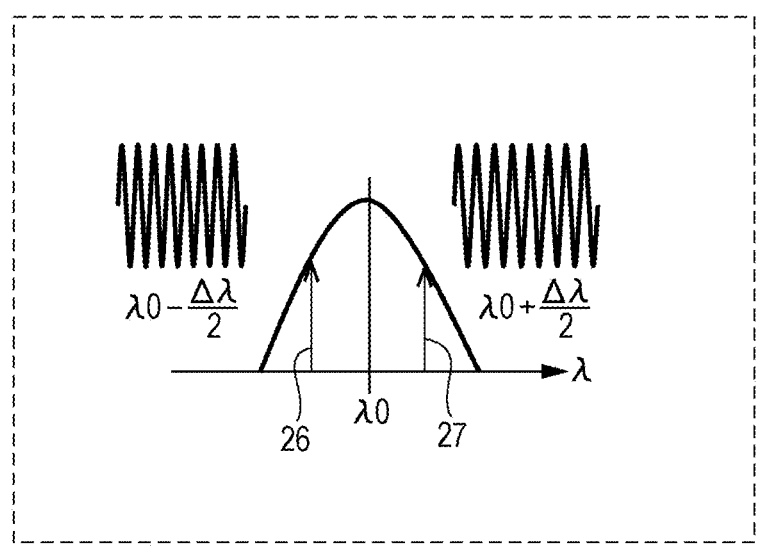
FIG. 11E is a fifth diagram for explaining a relationship between expanse of a wavelength of light (longitudinal mode width) from the wavelength $\lambda 0$ and a coherence length.

FIGS. 11A through 11E illustrate a relationship between expanse of wavelength (longitudinal mode width) of light from the wavelength λ0 and a coherence length of the light. FIG. 11A illustrates a case where the expanse of wavelength from the wavelength λ0 is zero. In this case, the coherence length is infinite as illustrated in FIG. 11 B. FIG. 11C illustrates a case where the expanse of wavelength (full width at half maximum) from the wavelength λ0 is Δλ. In this case, the coherence length σ0 is $λ0^2/Δλ$ as illustrated in FIG. 11D. The longitudinal mode width and the coherence length are in a relationship of Fourier transform and is called a Wiener-Khinchin theorem. This can be explained as follows. In FIG. 11E, the light whose expanse of wavelength from the wavelength λ0 is Δλ is replaced with light 26 having a wavelength of λ0-Δλ82 and light 27 having a wavelength of λ0+Δλ/2. A cycle of a beat that occurs due to interference between the light 26 and the light 27 is $λ0^2/Δλ$, and a wavelength of a carrier wave is an average λ0 of the wavelength of the light 26 and the wavelength of the light 27. Within the cycle of the beat, an oscillatory waveform of light is uniform and continuous. Meanwhile, between different cycles, continuity of an oscillatory waveform of light is lost, and correlation in phase is also lost. That is, the cycle of the beat $λ0^2/Δλ$ is a coherence length. The reason why solar light is incoherent is that expanse of wavelength (longitudinal mode width) Δλ is large, and the coherence length σ0 is $λ0^2/Δλ=1.0$ μm in a case where the central wavelength λ0 is set to 0.55 μm and the expanse Δλ of wavelength is set to 0.30 μm.

Figure 12A:
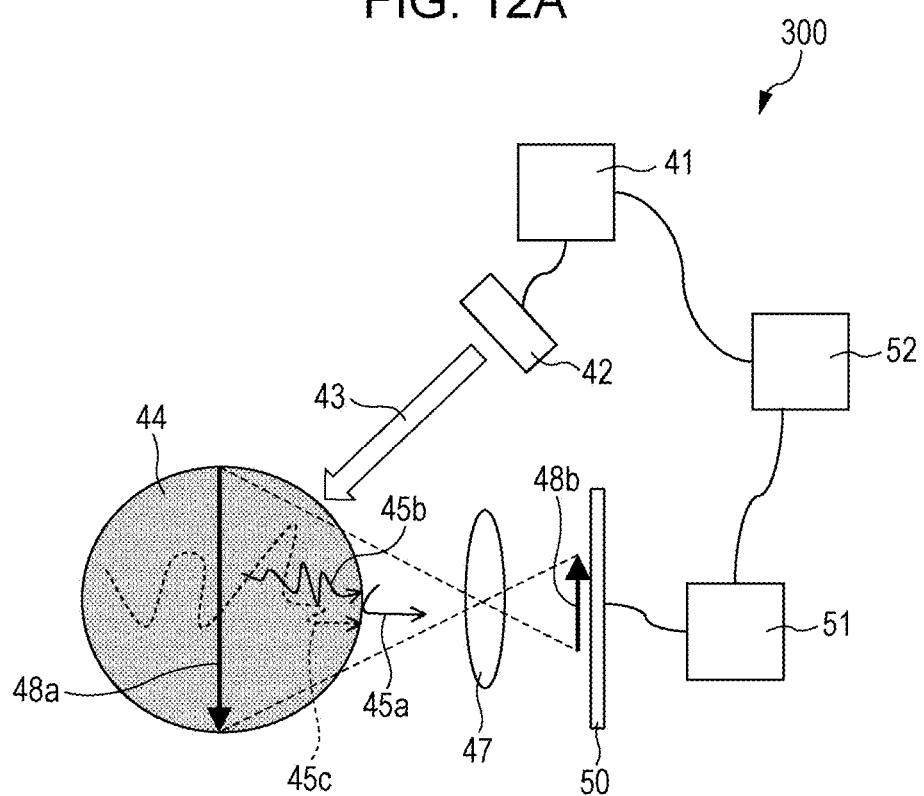
FIG. 12A is a cross-sectional view schematically illustrating a light detection system that is a second conventional example.

Next, a configuration similar to a light detection system disclosed in "Near-infrared Spectroscopy in a 1 -μm Wavelength Region: Current and Future" (The 14th Annual Meeting of Japanese Society for Medical Near Infrared Spectroscopy, pp. 139-144, Goro NISHIMURA) is described as a second conventional example. The light detection system in the second conventional example measures a light intensity distribution at each light propagation distance. FIG. 12A is a schematic cross-sectional view of a light detection system 300 in the second conventional example. A light source 42 emits laser light. As illustrated in FIG. 12A, light 43 having a wavelength λ0 is emitted from the light source 42 toward a subject 44. As a result, scattered light 45a, 45b, and 45c generated on a surface of the subject 44 or in the subject 44 is collected by a light collecting lens 47 and forms an image 48b on an image formation plane of the light collecting lens 47. A substantial object (a collection of object points) 48a corresponding to the image 48b exists on an object side of the lens. A light detector 50 is disposed on the image formation plane. The light detector 50 is a collection of a plurality of pixels and detects the amount of incident light in each pixel. The light source 42 is connected to a controller 41, and light emission of the light source 42 is controlled by the controller 41. The amount of light detected by the light detector 50 is processed in an arithmetic circuit 51 as a detection signal. The controller 41 and the arithmetic circuit 51 a are collectively controlled by a computer 52.

Figure 12B:
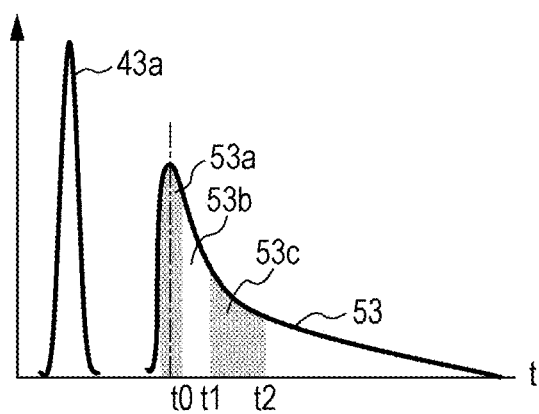
FIG. 12B is an explanatory view illustrating oscillation of a light source and a detection signal detected by a light detector in the light detection system illustrated in FIG. 12A.

FIG. 12B is an explanatory view illustrating a relationship between oscillation of the light source 42 and a signal detected by the light detector 50 in the light detection system 300 illustrated in FIG. 12A. The light source 42 oscillates a pulse 43a under control of the controller 41. The light 43 having the pulse 43a is scattered in the subject 44 and is received and detected as a signal 53 by the light detector 50. In FIG. 12B, the vertical axis represents an oscillation intensity of the light source 42 or a detection intensity of the light detector 50, and the horizontal axis represents an elapsed time. The detected signal 53 is wider in time width than the original pulse 43a due to an influence of a variation in optical path length caused by scattering. An output 53a at the beginning of the detected signal 53 is a signal of light 45a reflected by the surface of the subject 44. An output 53b between a time t0 and a time t1 after the output 53a is a signal of light 45b that is scattered in the subject 44 and whose scattering distance is short. An output 53c between the time t1 and a time t2 after the output 53b is a signal of light 45c whose scattering distance is long. The arithmetic circuit 51 time-divides the detected signal 53 under control of the computer 52 so that the outputs of the signals 53a, 53b, and 53c can be separately detected. Since the depth in the subject which the light passes through becomes deeper in the order of the outputs 53a, 53b, and 53c, pieces of information of different depths can be separated and analyzed.

According to the study of the inventors of the present invention, reference light 32B and 32C from the reflection mirror 34A is needed to measure the degree of coherence or a phase of light by using the Michelson interferometer 200 that is the first conventional example. This complicates the configuration.

According to the study of the inventors of the present invention, the light detection system that is the second conventional example has a limitation on the width of a divided time. It is therefore impossible to sufficiently secure resolution in a depth direction in diagnosis. For example, in a case where the width of a divided time is 300 picoseconds (ps), the depth resolution is approximately 90 mm, and is not suitable for diagnosis and inspection of a relatively small target such as a biological object.

An aspect (examined example) examined to solve the problems of the conventional examples is described before description of the embodiments of the present disclosure.

EXAMINED EXAMPLE

Figure 1A:
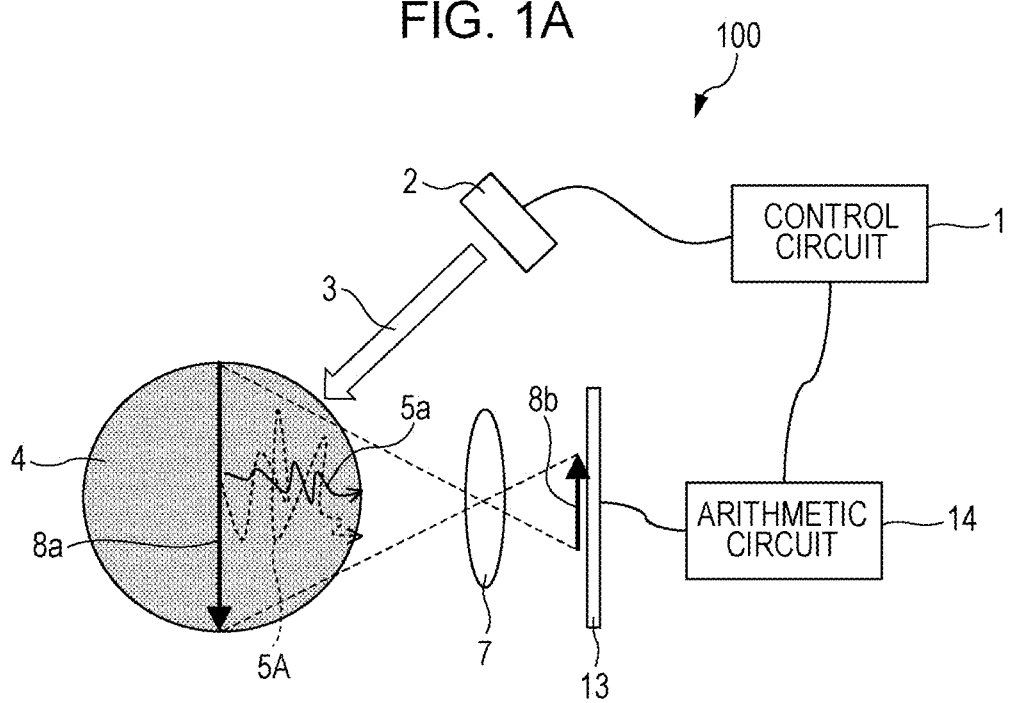
FIG. 1A is a schematic view of a light detection system according to an examined example of the present disclosure.

FIG. 1A is a schematic view of a light detection system 100 according to the present examined example. The light detection system 100 includes a light source 2, a light collecting lens 7, a light detection device 13, a control circuit 1, and an arithmetic circuit 14.

The light source 2 irradiates a subject (target) 4 with light 3 having a constant coherence length σ0. The light source 2 emits, for example, laser light that is a representative of coherent light. The light source 2 may successively emit light of a constant intensity or may emit pulsed light. Light emitted by the light source 2 can have any wavelength. In a case where the subject 4 is a biological object, the wavelength of the light source 2 can be set, for example, to not less than approximately 650 nm and not more than approximately 950 nm. It is known that this wavelength range is poorly absorbed in a body. This wavelength range is included in a wavelength range of red to infrared light. The term "light" as used herein encompasses not only visible light, but also infrared light.

The light collecting lens 7 is disposed between the subject 4 and the light detection device 13. The light collecting lens 7 collects scattered light 5a and 5A that is light emitted from the light source 2 toward the subject 4 and generated on a surface of the subject 4 or in the subject 4. The collected light forms an image 8b on an image formation plane of the light collecting lens 7. A substantial object (a collection of object points) 8a corresponding to the image 8b exists on an object side of the lens. In the example illustrated in FIG. 1A, the light collecting lens 7 includes a single lens but may include a plurality of lenses.

The light detection device 13 is disposed on the image formation plane of the light collecting lens 7. The light detection device 13 detects the scattered light 5a and 5A collected by the light collecting lens 7. A detailed structure of the light detection device 13 will be described later.

The arithmetic circuit 14 is connected to the light detection device 13 and performs arithmetic processing using an electric signal indicative of a light amount detected by the light detection device 13. The arithmetic circuit 14 can be, for example, an image processing circuit such as a digital signal processor (DSP).

The control circuit 1 is connected to the arithmetic circuit 14 and the light source 2. The control circuit 1 controls light detection of the light detection device 13, arithmetic processing of the arithmetic circuit 14, the amount of light emission, an ON timing, a continuous ON period, or a light emission wavelength or a coherence length of the light source 2 by executing a program stored, for example, in a memory. The control circuit 1 can be, for example, an integrated circuit such as a central processing unit (CPU) or a microcomputer. The control circuit 1 and the arithmetic circuit 14 may be a unified single circuit.

The light detection system 100 may include, for example, a display on which a result of the arithmetic processing in the arithmetic circuit 14 is displayed in addition to the constituent elements illustrated in FIG. 1A.

The light detection device 13 has a plurality of light transmitting regions and a plurality of light shielding regions that face a plurality of detectors (sometimes referred to as "light detection cells"), as described later. Light incident from a subject passes through the light transmitting regions and is blocked by the light shielding regions. Light that has passed through a light transmitting region enters a detector that faces the light transmitting region.

Figure 1B:
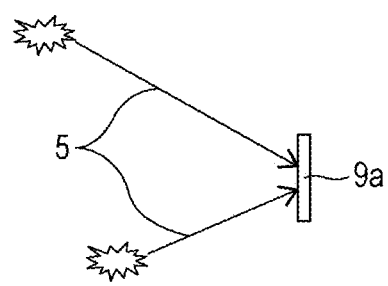
FIG. 1B illustrating scattered light that enters a single light transmitting region of a light detection device.

FIG. 1B illustrates scattered light 5 that enters a single light transmitting region 9a of the light detection device 13. The subject 4 is a scatterer. A light beam that propagates in the subject 4 repeats attenuation with an attenuation coefficient μa and scattering with a scattering coefficient FIG. 1B illustrates an example in which two light beams enter the light transmitting region 9a from two different positions. These light beams that have entered the light transmitting region 9a enter a detector that faces the light transmitting region 9a, and thus light amounts of the light beams are detected.

Figure 2A:
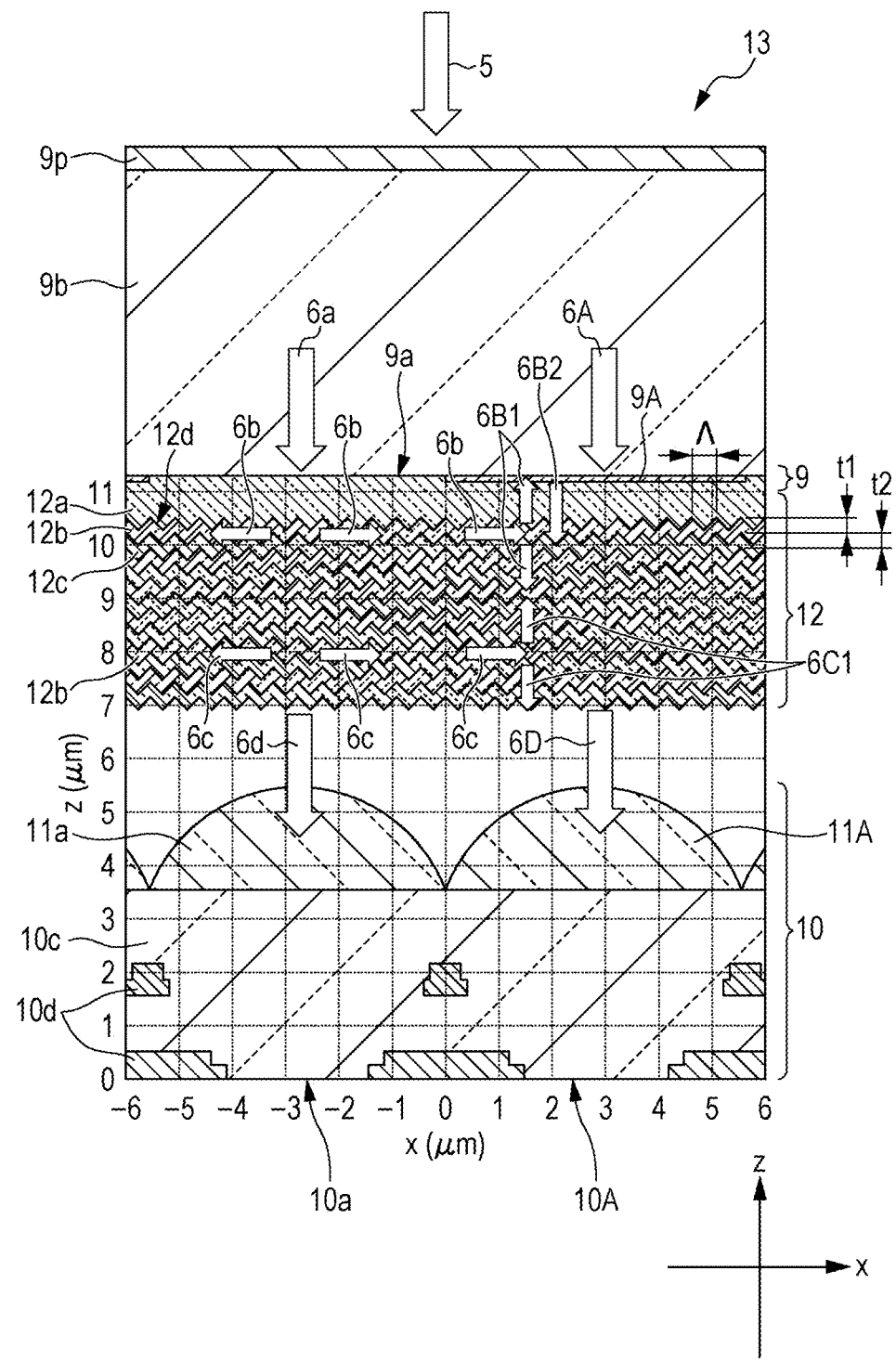
FIG. 2A is a cross-sectional view of the light detection device taken on a plane along a light incident direction in the examined example.

FIGS. 2A and 2B illustrate a configuration of the light detection device 13 according to the present examined example. For convenience of description, three axes (an x axis, a y axis, and a z axis) that are orthogonal to each other are illustrated in FIGS. 2A and 2B (these axes are also illustrated in other drawings). FIG. 2A is a cross-sectional view of the light detection device 13 taken along a light incident direction. FIG. 2B is a plan view illustrating a plane that is parallel with an xy plane including a light shielding film 9 of the light detection device 13. FIG. 2A illustrates a cross section that is parallel with an xz plane including the region surrounded by the broken line in FIG. 2B. The cross-sectional structure of FIG. 2A is periodically arranged as a unit structure in the xy plane in a two-dimensional manner.

As illustrated in FIG. 2A, the light detection device 13 includes a light detector 10, light coupling layer 12, and the light shielding layer 9 in this order. In the example illustrated in FIG. 2A, these members are stacked in the z direction. Furthermore, in the example illustrated in FIG. 2A, the light detection device 13 includes, on the light shielding layer 9, transparent substrate 9b and a bandpass filter 9p in this order. The bandpass filter 9p selectively transmits light of a wavelength band emitted by the light source 2.

The light detector 10 includes a plurality of detectors (light detection cells) 10a and 10A disposed in a two-dimensional manner in an in-plane direction (within the xy plane) of the light detector 10. The light detector 10 includes microlenses 11a and 11A, a transparent film 10c, metal films 10d such as wires, and photosensitive parts made of Si, an organic film, or the like in this order from a light incident side. The photosensitive parts in gaps between the metal films 10d correspond to the detectors 10a and 10A. The detectors 10a and 10A have detection sensitivity in the wavelength band of light emitted from the light source 2. Each of the plurality of microlenses 11a and 11A is disposed so as to face one of the plurality of detectors 10a and 10A. Light that is collected by the microlenses 11a and 11A and enters the gaps between the metal films 10d is detected by the detectors 10a and 10A.

The light coupling layer 12 is disposed on the light detector 10 and includes a first transparent layer 12c, a second transparent layer 12b, and a third transparent layer 12a in this order in a direction (the z-axis direction) perpendicular to a surface of the light detector 10. The first transparent layer 12c and the third transparent layer 12a are made of $SiO_2$ or the like. The second transparent layer 12b is made of $Ta_2O_5$ or the like. The second transparent layer 12b has a higher refractive index than the first transparent layer 12c and the third transparent layer 12a. The first transparent layer 12c, the second transparent layer 12b, and the third transparent layer 12a are hereinafter sometimes referred to as a first low-refractive-index layer, a first high-refractive-index layer, and a second low-refractive-index layer, respectively. The first transparent layer 12c and the third transparent layer 12a are hereinafter sometimes referred to as low-refractive-index transparent layers, and the second transparent layer 12b is hereinafter sometimes referred to as a high-refractive-index transparent layer. In the present disclosure, the terms "low refractive index" and "high refractive index" merely indicate a relative refractive index value and does not limit an absolute refractive index value of the layer.

The light detection device 13 may have a structure in which the high-refractive-index transparent layer 12b and the low-refractive-index transparent layer 12c are alternated in this order. In the example of FIG. 2A, the light detection device 13 has a structure in which the high-refractive-index transparent layer 12b and the low-refractive-index transparent layer 12c are alternated six times in total. The high-refractive-index transparent layer 12b is sandwiched between the low-refractive-index transparent layers 12c and 12a and is therefore functions as a waveguide layer. A linear grating 12d of a pitch Λ is provided all over an interface between the high-refractive-index transparent layer 12b and the low-refractive-index transparent layer 12c and an interface between the high-refractive-index transparent layer 12b and the low-refractive-index transparent layer 12a. A grating vector of the grating 12d is parallel with the x-axis in the in-plane direction (parallel with the xy plane) of the light coupling layer 12. The shape of a cross section of the grating 12d that is parallel with the xz plane is sequentially transferred onto the high-refractive-index transparent layers 12b and the low-refractive-index transparent layers 12c that are stacked. In a case where directivity of film formation of the transparent layers 12b and 12c in the stacking direction is high, transfer of the shape is easily maintained by making the xz cross section of the grating 12d S-shaped or V-shaped. The grating 12d need just be provided in at least part of the high-refractive-index transparent layer 12b. Since the high-refractive-index transparent layer 12b includes the grating 12d, incident light can be coupled with light (guided light) propagating in the high-refractive-index transparent layer 12b.

The light coupling layer 12 and the light detector 10 may be spaced by a narrow gap or may be in close contact with each other. This gap (including a space between the microlenses 11a and 11A) may be filled with a transparent medium such as an adhesive. In a case where the gap is filled with a transparent medium, the microlenses 11a and 11A need just be made of a material having a sufficiently larger refractive index than the transparent medium in order to obtain a lens effect in the microlenses 11a and 11A.

The light shielding layer 9 has a plurality of light shielding regions 9A and a plurality of light transmitting regions 9a. In the example illustrated in FIG. 2A, the light shielding regions 9A and the light transmitting regions 9a are formed by patterning a metal reflection layer made of Al on the transparent substrate 9b at hat will be described later. That is, regions where the metal reflection layer is provided are the light shielding regions 9A, and regions where no metal reflection layer is provided are the light transmitting regions 9a. The light shielding regions 9A need just have light reflectivity at least on a light coupling layer side. The light transmitting region 9a illustrated in FIG. 2A corresponds to a light transmitting region 9a1, 9a2, 9a3, 9a4, or the like in FIG. 2B, and the light shielding region 9A illustrated in FIG. 2A corresponds to a light shielding region 9A1, 9A2, 9A3, 9A4, or the like in FIG. 2B. That is, the light shielding layer 9 has the plurality of light shielding regions 9A and the plurality of light transmitting regions 9a in the in-plane direction (within the xy plane) of the light shielding layer 9. The plurality of light shielding regions 9A face the respective detectors 10A. The plurality of light transmitting regions 9a face the respective detectors 10a. As illustrated in FIG. 2B, the plurality of light shielding regions 9A (9A1 through 9A4) form a checkered pattern. These light shielding regions 9A (9A1 through 9A4) may form a pattern other than a checkered pattern and may form, for example, a striped pattern. The "striped pattern" refers to a pattern in which the plurality of light shielding regions 9A are aligned in one direction (e.g., the x direction or the y direction), the plurality of light transmitting regions 9a are aligned in the same direction so as to be adjacent to the plurality of light shielding regions 9A, and the plurality of light shielding regions 9A are aligned in the same direction so as to be adjacent to the plurality of light transmitting regions 9a. In other words, the striped pattern is a pattern in which the plurality of light transmitting regions 9a and the plurality of light shielding regions 9A are aligned in one direction alternately in a direction perpendicular to the one direction.

The transparent substrate 9b is disposed on the light incident side of the light shielding layer 9. The transparent substrate 9b is made of a light transmitting material such as $SiO_2$. The bandpass filter 9p is disposed on the light incident side of the transparent substrate 9b. The bandpass filter 9p selectively transmits only light having a wavelength in the vicinity of λ0 of the incident light 5. The wavelength λ0 is a wavelength of light emitted from the light source 2 in the air. The wavelength λ0 is, for example, a central wavelength in a case where the light source 2 emits light of a predetermined wavelength band. A polarization filter that transmits only light polarized in a specific direction may be disposed instead of the bandpass filter 9p or in addition to the bandpass filter 9p. In a case where such a polarization film is disposed between the light coupling layer 12 and the subject, only specific polarized light enters the light coupling layer 12. This makes it possible to increase the precision of detection of a degree of coherence that will be described later with reference to FIG. 5B. The specific polarized light can be, for example, S-polarized light having an electric field vector whose direction matches a direction (y direction) of a groove of a grating or may be P-polarized light having an electric field vector whose direction matches a direction (x direction) perpendicular to the direction of the groove of the grating.

The light 5 that enters the light detection device 13 passes through the bandpass filter 9p and/or the polarization filter and the transparent substrate 9b and then reaches, as light 6A and 6a, the light shielding regions 9A in which a reflection film is formed and the light transmitting regions 9a from which a reflection film is removed. The light 6A is blocked by the light shielding regions 9A, but the light 6a transmits the light transmitting regions 9a and enters the light coupling layer 12. The light 6a that has entered the light coupling layer 12 passes through the low-refractive-index transparent layer 12a and then enters the high-refractive-index transparent layer 12b. The grating is formed on upper and lower interfaces of the high-refractive-index transparent layer 12b, and guided light 6b is generated in the high-refractive-index transparent layer 12b in a case where the following formula 1 is satisfied:

$$\sin \theta = N - \mu 0/\Lambda \qquad \text{formula 1}$$

where N is an effective refractive index of the guided light 6b and θ is an incident angle with respect to a normal to an incident surface (the xy surface). In FIG. 2A, θ=0 since light enters the incident surface in a direction perpendicular to the incident surface. In this case, the guided light 6b propagates in the x direction within the xy plane.

A light component that passes through the high-refractive-index transparent layer 12b and enters a lower layer generates guided light 6c on the same condition as the formula 1 when entering the high-refractive-index transparent layers 12b on a lower layer side. Note that guided light that is generated in two layers is illustrated as representatives in FIG. 2A although guided light is actually generated in all of the high-refractive-index transparent layers 12b. The guided light 6c that is generated on the lower layer side also propagates in the x direction within the xy plane. The guided light 6b and 6c propagates while radiating light upward and downward at an angle θ (θ=0 in the example in FIG. 2A) with respect to the normal to the waveguide plane (parallel with the xy plane). Radiated light 6B1 and 6C1 thus radiated upward (toward the reflection film side) directly below the light shielding regions 9A is reflected by the light shielding regions 9A and becomes light 6B2 that travels downward along the normal to the reflection surface (the xy plane). Since the light 6B1, 6C1, and 6B2 satisfies the formula 1 with respect to the high-refractive-index transparent layer 12b, part of the light 6B1, 6C1, and 6B2 becomes the guided light 6b and 6c gain. This guided light 6b and 6c also generates new radiated light 6B1 and 6C1. This cycle is repeated. As a whole, directly below the light transmitting regions 9a, a component that has not become guided light (actually, a component that is finally radiated after being guided is added thereto, but this component is characterized as a component that has not become guided light) passes through the light coupling layer 12, enters the microlens 11a as transmitted light 6d, and is then detected by the detector 10a. Directly below the region 9A, a component that has become guided light is radiated, enters the microlens 11A as radiated light 6D, and is then detected by the detector 10A.

Each of the light transmitting regions 9a corresponds to the light transmitting region illustrated in FIG. 1B. Light that has passed through the light transmitting regions 9a branches into light to be detected by the detectors 10a directly below the light transmitting regions 9a and light to be detected by the detectors 10A on the left and right. Assume that the amounts of light detected by four detectors that face the light transmitting regions 9a1, 9a2, 9a3, aand 9a4 illustrated in FIG. 2B are q1, q2, q3, and q4, respectively, and the amounts of light detected by four detectors that face the light shielding regions 9A1, 9A2, 9A3, 9A4 illustrated in FIG. 2B are Q1, Q2, Q3, and Q4, respectively. The former four amounts of detected light are the amounts of detected light that has not become guided light, and the latter four amounts of detected light are the amounts of detected light that has become guided light. The amounts of light that has become guided light is not detected by the detector 10a directly below the light transmitting region 9a1, and the amount of light that has not become guided light is not detected by the detector 10A directly below the light shielding region 9A2.

The amount of detected light that has become guided light at a detection position directly below the light transmitting region 9a1 is defined as Q0=(Q1+Q2+Q3+Q4)/4 (or Q0=(Q1+Q2)/2), and the amount of detected light that has not become guided light at a detection position directly below the light shielding region 9A2 is defined as q0=(q1+q2+q3+q4)/4 (or q0=(q1+q2)/2). That is, an average of light amounts detected at detection positions directly below regions (pixels) adjacent to a certain region (a light shielding region or a light transmitting region) in the x direction and/or the y direction is defined. By applying this definition to all regions, the amount of detected light that has not become guided light and the amount of detected light that has become guided light can be defined in all detection regions (detectors) that constitute the light detector 10. The arithmetic circuit 14 defines the amount of detected light that has not become guided light and the amount of detected light that has become guided light in all of the detectors that constitute the light detector 10 as described above. Then, the arithmetic circuit 14 performs arithmetic processing such as generating an image by allocating a value of a ratio of these amounts (e.g., q1/Q0, Q0/q1, q0/Q2, or Q2/q0) or a value of a ratio of each amount to the sum of these amounts (e.g., Q0/(Q0+q1), q1/(Q0+q1), Q2/(Q2+q0), or q0/(Q2+q0)) calculated for each detector to a pixel corresponding to the detector.

Figure 3A:
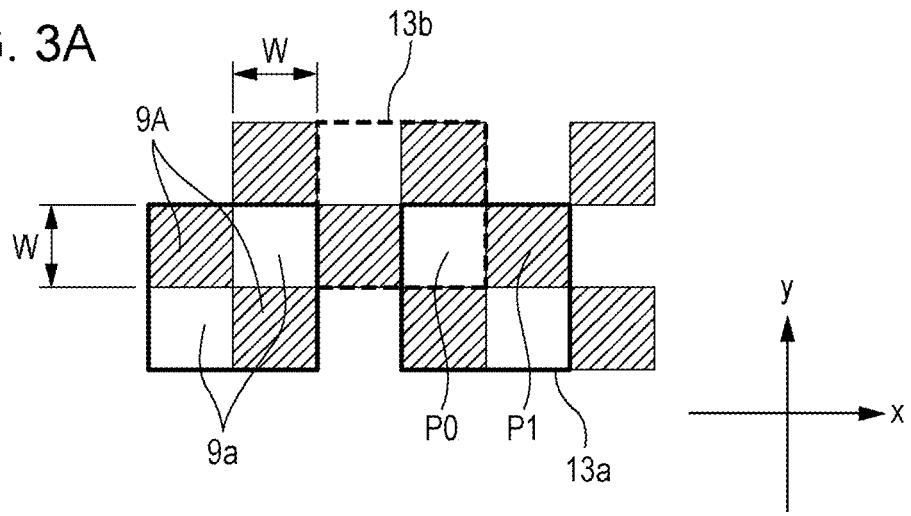
FIG. 3A is a plan view illustrating a pattern of light transmitting regions and light shielding regions in the examined example.
Figure 3B:
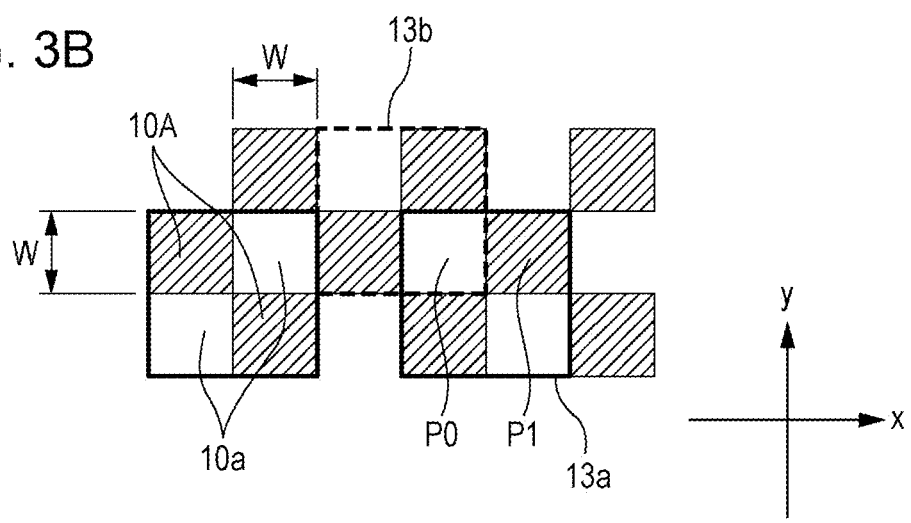
FIG. 3B is a plan view illustrating detectors directly below the light transmitting regions and the light shielding regions in the examined example.
Figure 3C:
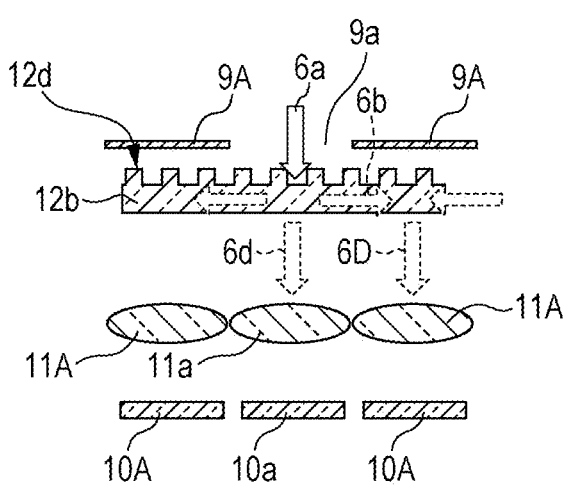
FIG. 3C is a cross-sectional view illustrating a positional relationship among constituent elements in the examined example.

FIGS. 3A and 3B illustrate a relationship between the pattern of the light transmitting regions 9a and the light shielding regions 9A and the detectors 10a and 10A directly below the light transmitting regions 9a and the light shielding regions 9A. FIG. 3A is a plan view illustrating the pattern of the light transmitting regions 9a and the light shielding regions 9A. FIG. 3B is a plan view illustrating the detectors 10a and 10A directly below the light transmitting regions 9a and the light shielding regions 9A. FIG. 3C illustrates a positional relationship among these members. The detector 10a and the detector 10A are located directly below the light transmitting region 9a and the light shielding region 9A, respectively. Assume that a detection region directly below the light transmitting regions 9a is P0 and that a detection region directly below the light shielding regions 9A is P1, P0 and P1 form a checkered pattern having a size of W×W. A pixel region 13a indicated by the solid line in FIGS. 3A and 3B includes two detection regions P0 and two detection regions P1, and a pixel region 13b indicated by the broken line in FIGS. 3A and 3B also includes two detection regions P0 and two detection regions P1. Even if the pixel regions are shifted in any way within the xy plane by an amount corresponding to the width (=W) of the light shielding regions 9A, each of the pixel regions always includes two detection regions P0 and two detection regions P1 although a positional relationship thereof may change. As described above, the detected light amounts are subjected to an interpolation process by calculating q0 and Q0 in the formula 1. If the resolution is determined by a pixel size, the resolution is 2W×2W that is the size of the pixel regions 13a and 13b. However, the resolution after the interpolation process improves to W×W since the same interpolation process applies even if the pixels are moved by the width W in any direction within the xy plane.

Figure 4A:
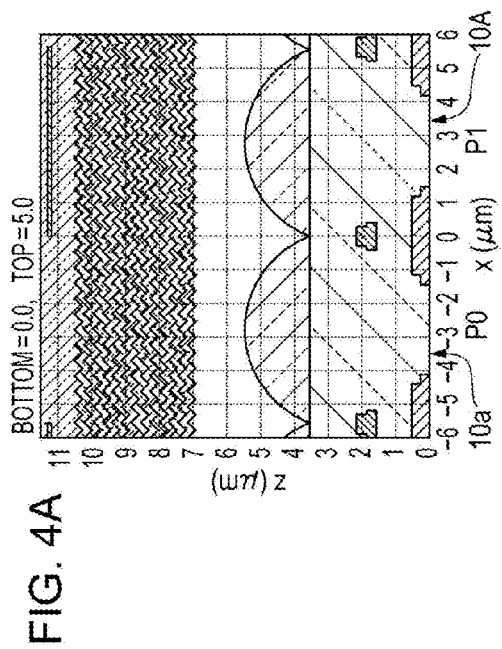
FIG. 4A is a cross-sectional view illustrating a configuration for electromagnetic analysis in the examined example.

FIGS. 4A through 4H illustrate how 1-pulse-oscillated incident light passes through the light coupling layer 12 and is then received by the light detector 10. FIG. 4A is the same cross-sectional view as FIG. 2A. FIGS. 4B through 4H illustrate, in chronological order, results of electromagnetic analysis of a light intensity distribution using a finite-difference time-domain (FDTD) and are drawn corresponding to FIG. 4A. In this analysis, the width W of each of the light transmitting regions 9a and the light shielding regions 9A in the x direction is 5.6 µm, the pitch of the grating is 0.46 µm, the depth of the grating in the z direction is 0.2 µm, the high-refractive-index transparent layer (the second transparent layer) is a $Ta_2O_5$ film, the thickness t1 of the high-refractive-index transparent layer in the z direction is 0.34 µm, the low-refractive-index transparent layer (the first transparent layer) is a $SiO_2$ film, and the thickness t2 of the low-refractive-index transparent layer in the z direction is 0.22 µm.

Figure 4B:
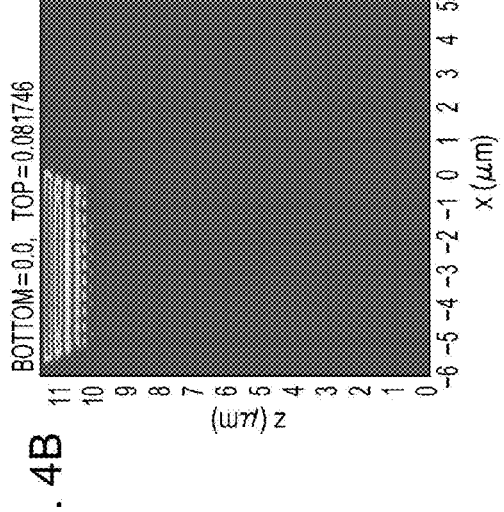
FIG. 4B is a first diagram illustrating how 1-pulse incident light passes through a light coupling layer and is then received by a light detector in the examined example.
Figure 4C:
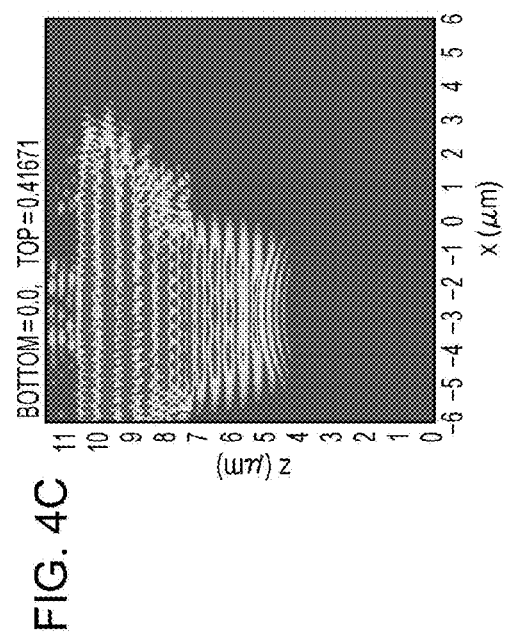
FIG. 4C is a second diagram illustrating how 1-pulse incident light passes through a light coupling layer and is then received by a light detector in the examined example.
Figure 4D:
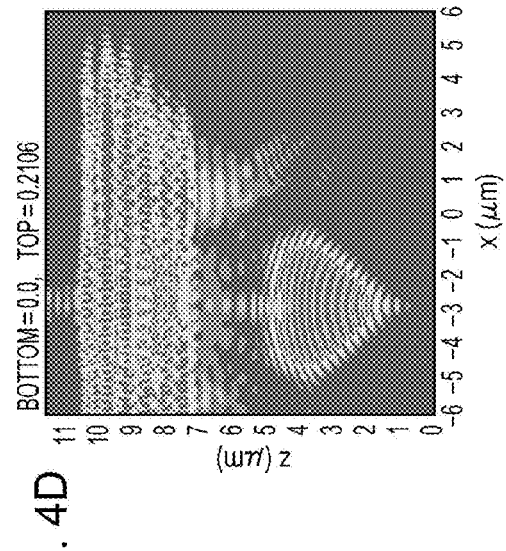
FIG. 4D is a third diagram illustrating how 1-pulse incident light passes through a light coupling layer and is then received by a light detector in the examined example.
Figure 4E:
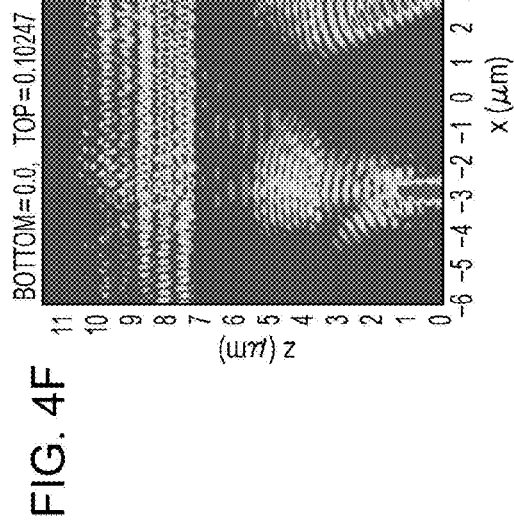
FIG. 4E is a fourth diagram illustrating how 1-pulse incident light passes through a light coupling layer and is then received by a light detector in the examined example.
Figure 4F:
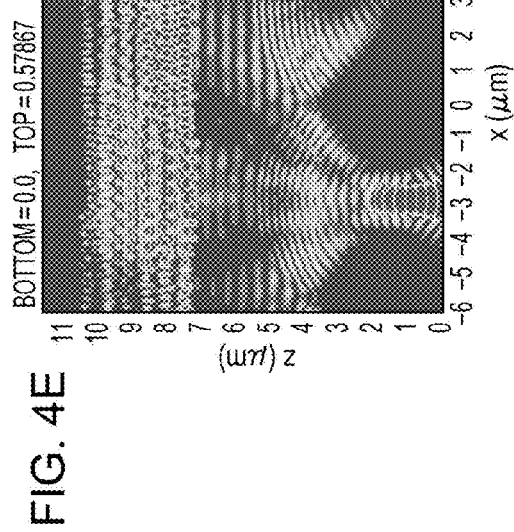
FIG. 4F is a fifth diagram illustrating how 1-pulse incident light passes through a light coupling layer and is then received by a light detector in the examined example.
Figure 4G:
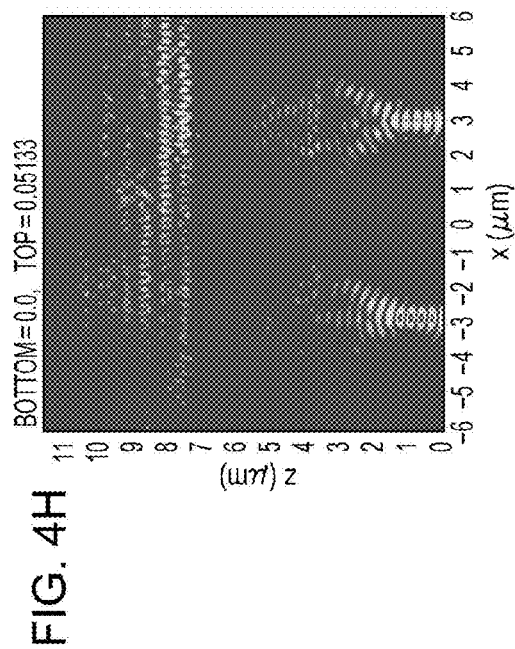
FIG. 4G is a sixth diagram illustrating how 1-pulse incident light passes through a light coupling layer and is then received by a light detector in the examined example.
Figure 4H:
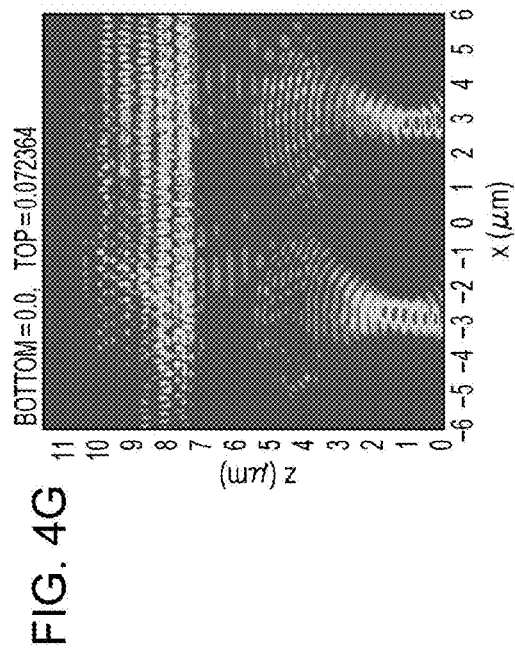
FIG. 4H is a seventh diagram illustrating how 1-pulse incident light passes through a light coupling layer and is then received by a light detector in the examined example.

In FIG. 4B, the S-polarized light 6a having a wavelength $\lambda 0$ of 850 nm that has been pulse-oscillated so that a half width is 11fs (3.3 µm when converted into a propagation distance) passes through the light transmitting regions 9a. In FIG. 4C, oscillation of the light 6a ends, and the guided light 6b and 6c that propagates in the stacked high-refractive-index transparent layers 12b is generated, and a component that has not become guided light passes through the light coupling layer 12 as it is and enters the microlens 11a as the light 6d. In FIG. 4D, the guided light 6b and 6c propagates to a region below the light shielding regions 9A while radiating the light 6B1 and 6C1 upward and downward. Meanwhile, the transmitted light 6d is collected onto the detector 10a by the microlens 11a. In FIG. 4E, the transmitted light 6d enters the detector 10a. Meanwhile, the radiated light 6B1 and 6C1 and the reflected light 6B2 form the radiated light 6D and enter the microlens 11A and are thus collected. In FIGS. 4F through 4H, the transmitted light 6d and the radiated light 6D are collected and enter the detectors 10a and 10A, respectively.

Note that as is clear from FIGS. 4E through 4H, the guided light 6b and 6c is not fully radiated in a range below the light shielding regions 9A and part thereof reaches a range of an adjacent right-side light transmitting region in a state of guided light. Since a radiation loss coefficient (easiness of radiation of guided light) becomes larger as the depth of a grating becomes deeper, the amount of radiated light and the amount of detected light can be made larger as the depth of the grating in a region below the light shielding region 9A is made deeper.

Figure 5A:
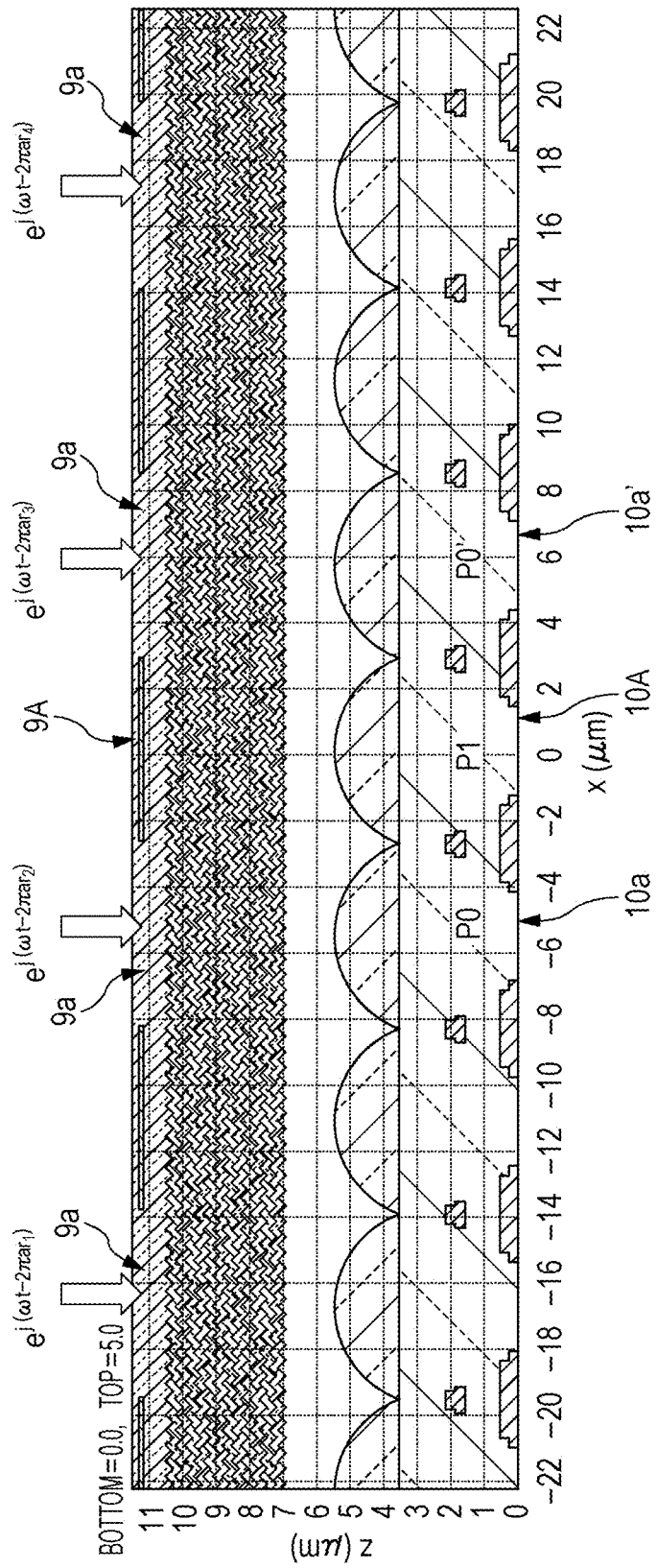
FIG. 5A is a cross-sectional view illustrating a positional relationship among light that enters four light transmitting regions and three detectors located below the light transmitting regions in the examined example.

FIG. 5A is a cross-sectional view illustrating a positional relationship between light that enters the four light transmitting regions 9a and three detectors 10a, 10A, and 10a' located below the light transmitting regions 9a according to the examined example. In the example illustrated in FIG. 5A, light having randomly different phases enters the four light transmitting regions 9a. In FIG. 5A, ω is an angular frequency of light ($\omega=2\pi c/\lambda 0$, c is light speed), t is a time, r1, r2, r3, and r4 are random functions (functions having random values between 0 and 1), and a is a random rate (the amplitude of the random values).

Figure 5B:
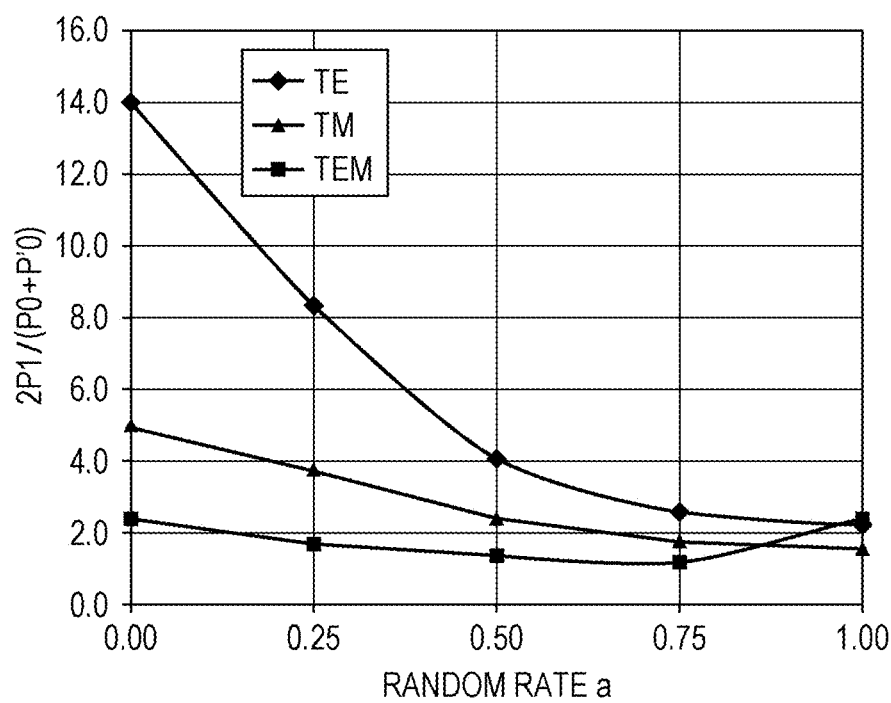
FIG. 5B is a diagram illustrating a result of analysis of a relationship between a random rate of incident light and a detection signal.

FIG. 5B illustrates a result of analysis of a relationship between a random rate of incident light and a detection signal. Assume that a detector directly below the light shielding region 9A located between central two of the four light transmitting regions 9a is 10A, detectors directly below the two light transmitting regions 9a adjacent to the detector 10A are 10a and 10a', light amounts detected by the detectors 10A, 10a, and 10a' are P1, P0, and P0', respectively, and the detection signal is defined as 2P1/(P0+P0'). In FIG. 5B, the diamond shape, the square shape, and the triangle shape indicate analysis results obtained under conditions: TE mode incidence (S polarization), TM mode incidence (P polarization), and TEM mode incidence (random polarization, circular polarization, or polarization at 45 degrees), respectively. Under the conditions of TE mode incidence and TEM mode incidence, the detection signal decreases as the rate a increases. Note that a=0 corresponds to a coherent state where phases are uniform, and a=1 corresponds to an incoherent state. The degree of coherence (randomness of the phases) of the incident light can be found from the results illustrated in FIG. 5B on the basis of the value of the detection signal 2P1/(P0+P0'). The detection signal is correlated with a phase difference (not illustrated in FIG. 5B), and therefore the phase difference can also be measured on the basis of the detection signal. In this example, 2P1/(P0+P0') is used as the detection signal, but another signal may be used as the detection signal. The arithmetic circuit 14 may output, as the detection signal, at least one of (1) a signal indicative of a ratio P1/P0 of a second light amount P1 to a first light amount P0, (2) a signal indicative of a ratio P0/(P0+P1) of the first light amount P0 to the sum of the first light amount P0 and the second light amount P1, and (3) a signal indicative of a ratio P1/(P0+P1) of the second light amount P1 to the sum of the first light amount P0 and the second light amount P1 where the first light amount P0 is a light amount detected by the detector that faces the light transmitting region 9a and the second light amount P1 is a light amount detected by the detector 10A that faces the light shielding region 9A. Each of these detection signals is correlated with the random rate a, and therefore the degree of coherent of the incident light can be found on the basis of the detection signal.

Figure 6:
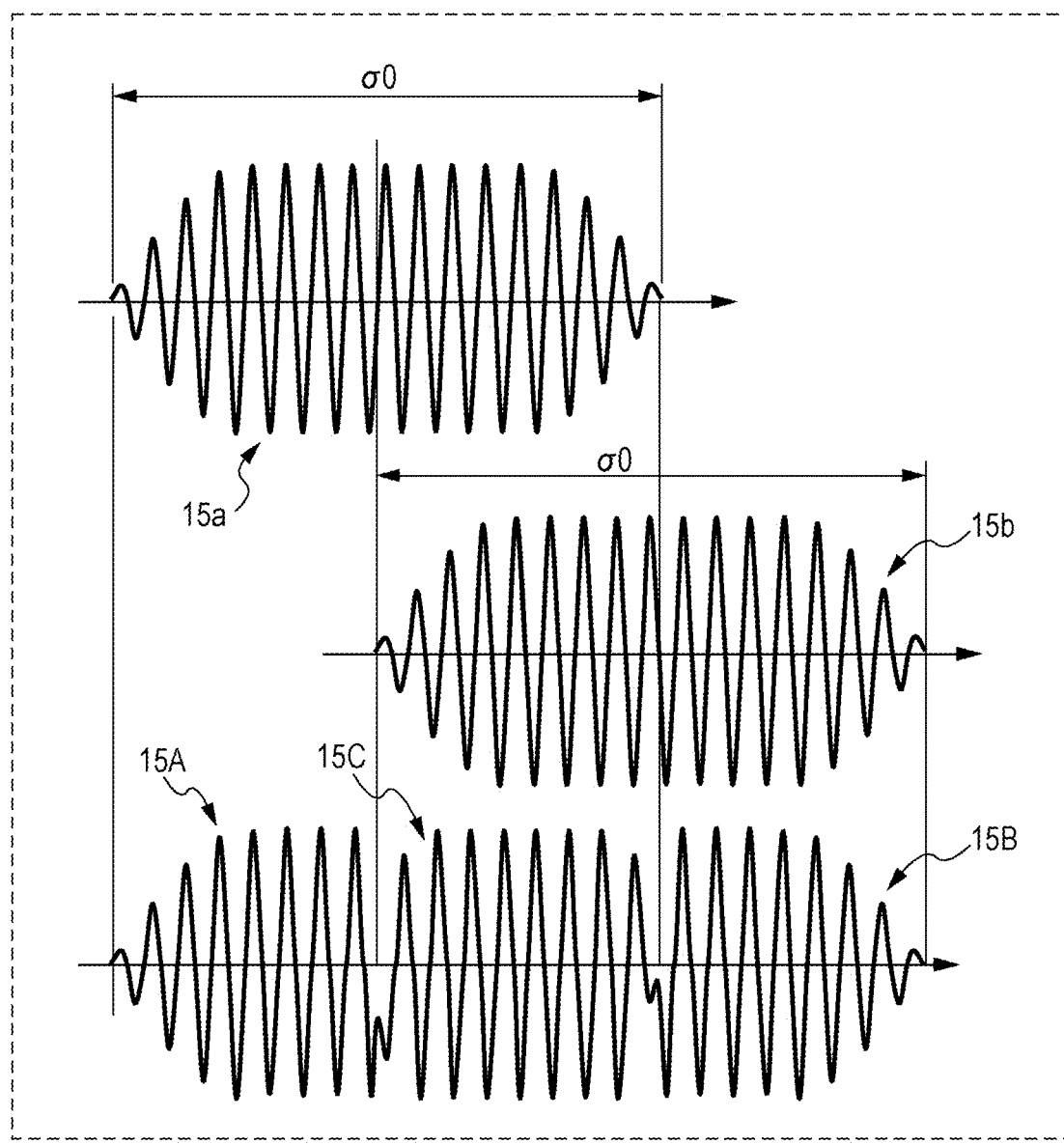
FIG. 6 illustrates an example of wave trains that enter one of the light transmitting regions illustrated in FIG. 5A.

FIG. 6 illustrates an example of wave trains that enter one of the light transmitting regions 9a illustrated in FIG. 5A. The light source 2 emits light of a constant coherence length σ0. All of wave trains 15a and 15b that enter the light transmitting region 9a have the same coherence length σ0 assuming that the coherence length does not change in the subject 4. However, the wave trains 15a and 15b enter the light transmitting region 9a at different timings due to scattering. A wave train that has the same coherence length σ0 and has a different phase follow the wave trains 15a and 15b. As illustrated in FIG. 6, in a case where the two wave trains 15a and 15b having the same wavelength and randomly shifted phases are successively incident, the wave trains 15a and 15b interfere with each other to form three wave trains 15A, 15B, and 15C. The wave train 15C is a wave train that is generated by overlapping and interference between the wave trains 15a and 15b. The wave trains 15A and 15B are remaining parts of the wave train 15a and the wave train 15b that do not overlap each other. The wave trains 15A, 15B, and 15C have the same wavelength, and the expanse of wavelength (longitudinal mode width) of the composite wave (the wave trains 15A, 15B, and 15C) is the same as that of the original wave trains 15a and 15b. That is, a coherence length defined by time coherence does not change (see FIGS. 11A through 11E). However, there is no correlation in phase among the wave trains 15A, 15B, and 15C, and continuity of the waves, i.e., the length of waves having a continuous phase is effectively shorter than the original length σ0.

Next, a result of calculation of an intensity distribution of incident light using a light beam tracing technique using a Monte Carlo method on the assumption that a human head is used as a subject is described with reference to FIGS. 7A through 7F.

Figure 7B:
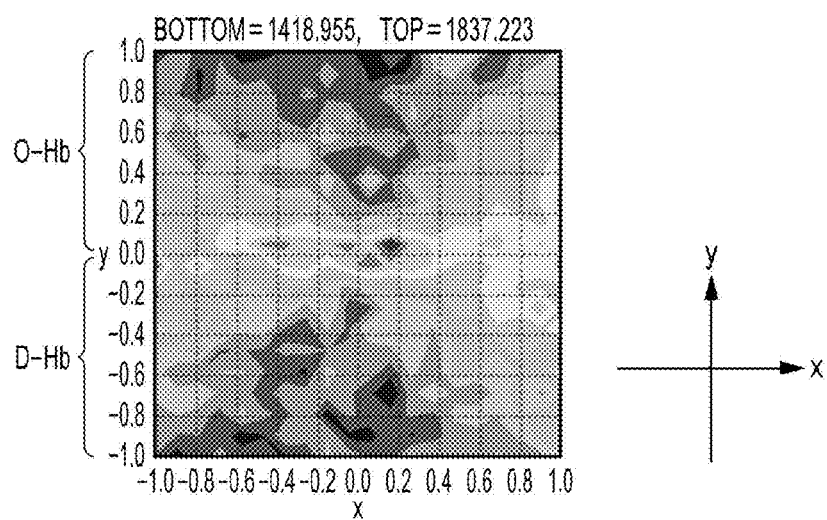
FIG. 7B is a diagram illustrating a light intensity distribution obtained in the analysis in the examined example.
Figure 7C:
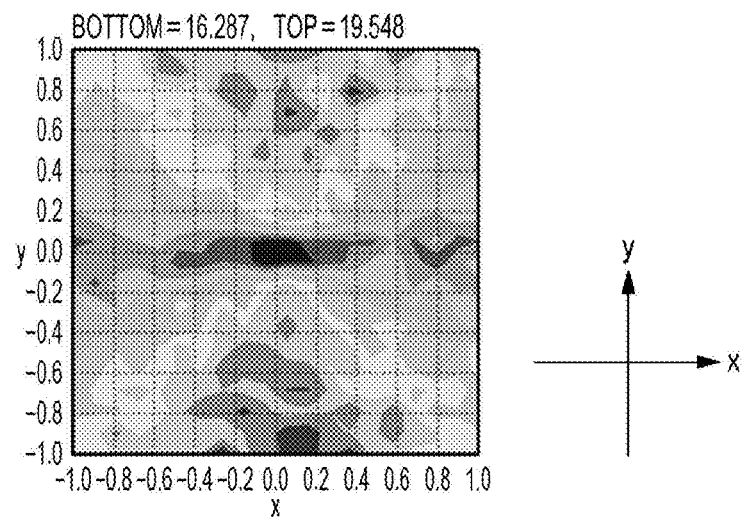
FIG. 7C is a diagram illustrating a distribution of an average of optical path lengths obtained in the analysis in the examined example.
Figure 7D:
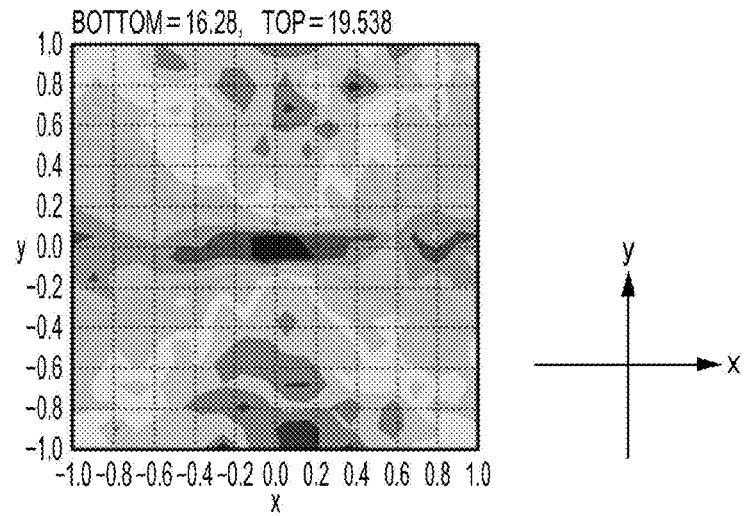
FIG. 7D is a diagram illustrating a distribution of standard deviations of optical path lengths obtained in the analysis in the examined example.

FIG. 7A illustrates overall optical arrangement and light beam tracing in the analysis. FIGS. 7B through 7D illustrates a result of analysis of an image 8b at a detection position that is divided into 20×20 regions. FIG. 7B illustrates a light intensity distribution, FIG. 7C illustrates an optical path length average distribution, and FIG. 7D illustrates an optical path length standard deviation distribution. As illustrated in FIG. 7A, the human head includes a scalp 4a, a skull 4b, a cerebrospinal fluid (CFS) layer 4c, a blood layer 4e, and a gray matter 4d. Table illustrates absorption coefficients (1/mm), scattering coefficients (1/mm), anisotropic scattering parameters, and film thicknesses (mm) of the respective parts. The blood layer 4e has an oxygenated hemoglobin layer and a reduced hemoglobin layer that are arranged in a direction normal to the paper on which FIG. 7A is drawn.

TABLE

| | absorption coefficient (1/mm) | scattering coefficient (1/mm) | anisotropic scattering parameter | film thickness (mm) |
|---|---|---|---|---|
| scalp | 0.030 | 0.73 | 0.90 | 2.0 |
| skull | 0.012 | 1.80 | 0.90 | 4.0 |
| CFS layer | 0.002 | 0.30 | 0.90 | 1.0 |
| blood layer (oxygenated hemoglobin layer/reduced hemoglobin layer) | 0.28/0.16 | 50.5/66.8 | 0.992 | 5.0 |
| gray matter | 0.036 | 2.30 | 0.90 | 10.0 |

An analysis region is 60 mm×60 mm in the xy direction and 22 mm in the z direction, and light beams that propagate out of this region is excluded from calculation. It is assumed that incident light 3 perpendicularly enters a surface of the scalp 4a at 9 (3×3) positions that are spaced away from each other by 5 mm in both x and y directions so that a central one of the positions is a position shifted by 15 mm from the center (x=y=0) of the scalp 4a in the −x direction. An image 8b on an image formation plane is calculated from light beams that are taken in on conditions that the light collecting lens 7 is placed away by 1000 mm from the surface of the scalp 4a and an object-side numerical aperture (=sin α) is 0.1. The detection target region illustrated in FIGS. 7B through 7D is a region within a range of a width 0.8 mm in x and y directions from a position shifted in the +x direction by 15 mm from the center (x=y=0) of the scalp 4a. A distribution of scattered light from this region is obtained by calculation. In FIG. 7B, a whiter region has a higher intensity. In FIGS. 7C and 7D, a whiter region has a larger value. A region of y>0 corresponds to the oxygenated hemoglobin layer, and a region of y<0 corresponds to the reduced hemoglobin layer. In FIGS. 7B through 7D, there is a slight difference between the oxygenated hemoglobin layer and the reduced hemoglobin layer. Since an image inverted by the light collecting lens 7 is obtained, the positions of the oxygenated hemoglobin layer and the reduced hemoglobin layer in the image are reverse to actual positions.

Assume that the light source 2 oscillates light having a coherence length of σ0. In a case where a standard deviation of an optical path length is equal to or smaller than the coherence length σ0, it is likely that received light is within the same wave train, and correlation of phases is high. In this case, the received light appears as a mixture of bright and dark parts. Meanwhile, in a case where the standard deviation of the optical path length is equal to or larger than σ0, it is likely that wave trains of the received light are different, and there is no correlation of phases (see FIG. 10). In this case, the received light has uniform brightness at any position. As described with reference to FIG. 5B, the degree of coherence of incident light is related, for example, to the detection signal 2P1/(P0+P0'), P1/P0, or P1/(P0+P1). It is therefore possible to determine whether or not the standard deviation of incident light is equal to or larger than the coherence length σ0 on the basis of the value of the detection signal.

Figure 7E:
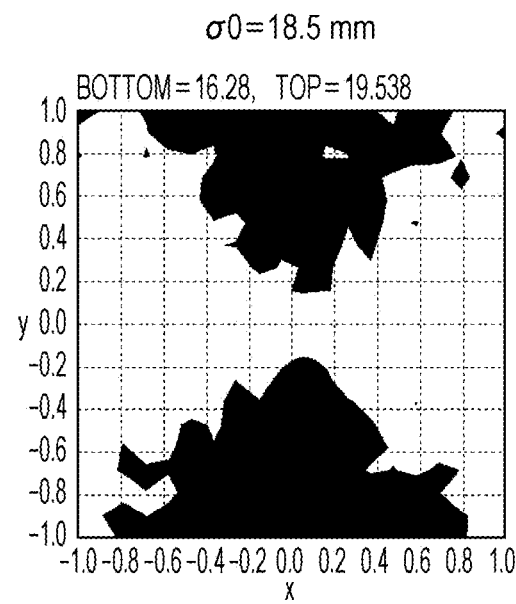
FIG. 7E illustrates an example of a distribution of a detection signal obtained in the analysis in the examined example.
Figure 7F:
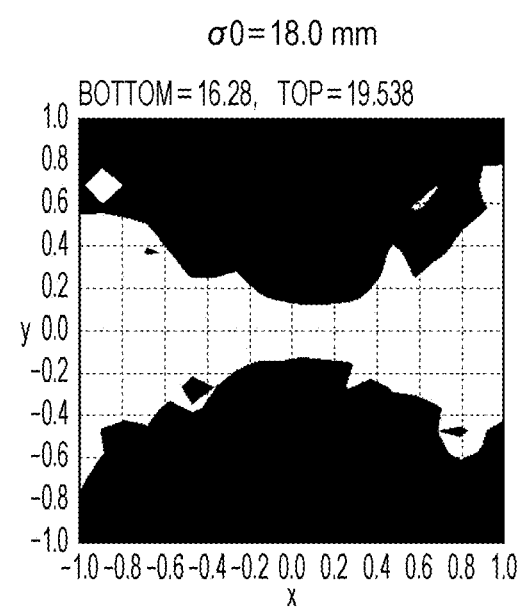
FIG. 7F illustrates another example of a distribution of a detection signal obtained in the analysis in the examined example.

FIGS. 7E and 7F illustrate an example of a distribution of a detection signal (P1/P0 in this example). FIG. 7E illustrates an example in which σ0=18.5 mm, and FIG. 7F illustrates an example in which σ0=18.0 mm. The black regions in FIGS. 7E and 7F represent regions where the detection signal is uniformly small. In the example illustrated in FIG. 7E in which σ0=18.5 mm, the detection signal is small in regions (black regions) in which the standard deviation of the optical path length exceeds 18.5 mm. Meanwhile, in the example illustrated in FIG. 7F in which σ0=18.0 mm, the detection signal is small in regions (black regions) in which the standard deviation of the optical path length exceeds 18.0 mm. Accordingly, in the example of FIG. 7F, the regions (black regions) in which the detection signal is small are wider than those in the example of FIG. 7E. In FIGS. 7E and 7F, in a region other than the black regions, places in which the detection signal is large and places in which the detection signal is small are mixed in a narrow range, and the value of the detection signal irregularly changes depending on the position. It is possible to know scattering in a subject by analyzing the black regions while using the coherence length σ0 as a parameter.

Therefore, the control circuit 1 controls the light source 2, the light detection device 13, a and the arithmetic circuit 14 so that the coherence length of light emitted from the light source 2 is changed and an image is taken for each changed coherence length. The arithmetic circuit 14 generates and outputs, for each coherence length of light changed by the control circuit 1, for example, at least one of (1) a signal indicative of a ratio P1/P0 of the second light amount P1 to the first light amount P0, (2) a signal indicative of a ratio P0/(P0+P1) of the first light amount P0 to the sum of the first light amount P0 and the second light amount P1, and (3) a signal indicative of a ratio P1/(P0+P1) of the second light amount P1 to the sum of the first light amount P0 and the second light amount P1. It is possible to know scattering in the subject on the basis of these signals.

As the light source 2 that makes the coherence length variable, light sources such as a high-frequency superimposing semiconductor laser and a sweep light source (a light source that periodically sweeps a laser wavelength in a range of several nm to several tens of nm) have been put into practice. For example, a semiconductor laser driven by a high-frequency superimposing circuit (in general, a frequency of 300 MHz) oscillates in a coherence length ranging from 0.1 mm to 0.2 mm and can make the coherence length variable within a range from 0.2 mm to several tens of mm by changing the frequency, amplitude, or the like of the superimposing circuit (e.g., reducing the frequency). Furthermore, in a sweep light source, a coherence length can be made variable within a range from 0.3 mm to several tens of mm by changing a wavelength fluctuation width or a cycle (frequency). In a case where the sweep light source is used, the bandpass filter 9p is used in some cases to limit a wavelength of light that enters the light coupling layer 12. Furthermore, a desired coherence length can be obtained by combining a light source having a wide line width such as an LED and a bandpass filter having a narrow bandwidth. Furthermore, two or more light sources having different wavelengths may be used. When light from these light sources is scattered in the subject and enters the light transmitting region 9a, a beat occurs according to the principle described in FIG. 11C, and a coherence length becomes short according to a wavelength difference of light from the two light sources. In a case where a plurality of light sources having different wavelengths are used, this may be associated with an operation of changing a light emission intensity ratio of the light sources.

As described above, according to the light detection system 100 of the present examined example, a distribution difference between oxygenated hemoglobin and reduced hemoglobin inside the skull 4b of the subject illustrated in FIG. 7A can be detected as an output difference of an electric signal. This does not require time division and therefore makes it possible to markedly simplify measurement as compared with a method (second conventional example) for detecting an optical intensity distribution image described with reference to FIGS. 12A and 12B. Furthermore, it is possible to compare and analyze scattering in a subject just by changing the coherence length of the light source 2 a and increase the resolution of measurement.

However, the light detection device of the examined example has a room for improvement in terms of resolution. In order to achieve sufficient input coupling (i.e., conversion of incident light into guided light) in the light coupling layer 12, it is necessary to make the width W of the light transmitting regions 9a and the light shielding regions 9A in the x direction sufficiently large. More specifically, the width W need be approximately 10 times the pitch (i.e., period) A of the grating. This restricts the resolution after the interpolation process to the width W even if the interpolation process described with reference to FIGS. 3A and 3B is used.

In view of this, a light detection device according to an aspect of the present disclosure is configured such that each light transmitting region faces two or more first detectors, and each light shielding region faces two or more second detectors. According to such a configuration, it is possible to increase the resolution of detection as described later.

A light detection system according to another aspect of the present disclosure calculates, for example, a ratio of a second light amount, which is the sum of light amounts detected by two or more second detectors that face a light shielding region to a first light amount, which is the sum of light amounts detected by two or more first detectors that face a light transmitting region, a ratio of the second light amount to the sum of the first light amount and the second light amount, or a ratio of the first light amount to the sum of the first light amount and the second light amount. A degree of coherence of a phase of light can be measured on the basis of the value of this ratio.

The present disclosure includes a light detection device and a light detection system described in the following items.

[Item 1]

A light detection device according to Item 1 of the present disclosure includes:

a light detector that has a main surface and includes first detectors and second detectors that are both disposed along the main surface;

a light coupling layer disposed on or above the light detector, the light coupling layer including a first low-refractive-index layer, a first high-refractive-index layer that is disposed on the first low-refractive-index layer and includes a first grating, and a second low-refractive-index layer that is disposed on the first high-refractive-index layer, the first high-refractive-index layer having a higher refractive index than the first low-refractive-index layer and the second low-refractive-index layer; and a light shielding film that is disposed on the light coupling layer and includes a light transmitting region and a light shielding region adjacent to the light transmitting region, wherein:

the light transmitting region faces two or more first detectors included in the first detectors, and the light shielding region faces two or more second detectors included in the second detectors.

[Item 2]

The light detection device according to Item 1 may be configured such that a plurality of light transmitting regions are provided in the light shielding film, each of the plurality of light transmitting regions being the light transmitting region; and a plurality of light shielding regions are provided in the light shielding film, each of the plurality of light shielding regions being the light shielding region.

[Item 3]

The light detection device according to Item 1 or 2 may be configured such that

The light detector includes first microlenses each of which is disposed between a corresponding one of the first detectors and the light coupling layer; and second microlenses each of which is disposed between a corresponding one of the second detectors and the light coupling layer.

[Item 4]

The light detection device according to any one of Items 1 through 3 may be configured such that the light coupling layer further includes a third low-refractive-index layer disposed between the first low-refractive-index layer and the light detector, and a second high-refractive-index layer disposed between the third low-refractive-index layer and the first low-refractive-index layer and including a second grating; and the second high-refractive-index layer has a higher refractive index than the first low-refractive-index layer and the third low-refractive-index layer.

[Item 5]

The light detection device according to any one of Items 1 through 4 may be configured such that one of two surfaces of the light shielding region that is closer to the light coupling layer has light reflectivity.

[Item 6]

A light detection system according to Item 6 of the present disclosure includes:

a light detection device according to item 1; and an arithmetic circuit connected to the light detection device, wherein the arithmetic circuit, in operation, outputs at least one signal selected from the group consisting of (1) a first signal indicating a ratio of a second light amount to a first light amount, (2) a second signal indicating a ratio of the first light amount to a sum of the first light amount and the second light amount, and (3) a third signal indicating a ratio of the second light amount to the sum of the first light amount and the second light amount, the first light amount being a sum of light amounts detected by the two or more first detectors, and the second light amount being a sum of light amounts detected by the two or more second detectors.

[Item 7]

The light detection system according to Item 6 may be configured such that a plurality of light transmitting regions are provided in the light shielding film, each of the plurality of light transmitting regions being the light transmitting region;

a plurality of light shielding regions are provided in the light shielding film, each of the plurality of light shielding regions being the light shielding region; and the arithmetic circuit, in operation, outputs the at least one signal for each pair of adjacent light transmitting region and light shielding region among the plurality of light transmitting regions and the plurality of light shielding regions.

[Item 8]

The light detection system according to Item 7 may be configured such that the arithmetic circuit, in operation, generates image information representing the pair in which a value of the at least one signal is equal to or larger than a threshold value and the pair in which the value of the at least one signal is smaller than the threshold value.

[Item 9]

The light detection system according to any one of Items 6 through 8, may further includes a light source that, in operation, emits light of a wavelength band, wherein the light detection device may further include a bandpass filter that is disposed on or above the light coupling layer and selectively transmits the light of the wavelength band.

[Item 10]

The light detection system according to any one of Items 6 through 8, may further includes:

a light source; and a control circuit that, in operation, controls the light source, the control circuit, in operation, changing a coherence length of light emitted from the light source.

[Item 11]

The light detection system according to Item 10 may be configured such that the arithmetic circuit, in operation, outputs the at least one signal for each coherence length of the light changed by the control circuit.

[Item 12]

The light detection device according to any one of Items 1 through 5 may be configured such that the first grating includes a plurality of grooves extending in a first direction;

a length of the light transmitting region in the first direction is shorter than a length of the light transmitting region in a second direction perpendicular to the first direction in plan view; and a length of the light shielding region in the first direction is shorter than a length of the light shielding region in the second direction in plan view.

In the present disclosure, all or a part of any of circuit, unit, device, part or portion, or any of functional blocks in the block diagrams may be implemented as one or more of electronic circuits including, but not limited to, a semiconductor device, a semiconductor integrated circuit (IC) or a large scale integration (LSI). The LSI or IC can be integrated into one chip, or also can be a combination of plural chips. For example, functional blocks other than a memory may be integrated into one chip. The name used here is LSI or IC, but it may also be called system LSI, very large scale integration (VLSI), or ultra large scale integration (ULSI) depending on the degree of integration. A Field Programmable Gate Array (FPGA) that can be programmed after manufacturing an LSI or a reconfigurable logic device that allows reconfiguration of the connection or setup of circuit cells inside the LSI can be used for the same purpose.

Further, it is also possible that all or a part of the functions or operations of the circuit, unit, device, part or portion are implemented by executing software. In such a case, the software is recorded on one or more non-transitory recording media such as a ROM, an optical disk or a hard disk drive, and when the software is executed by a processor, the software causes the processor together with peripheral devices to execute the functions specified in the software. A system or apparatus may include such one or more non-transitory recording media on which the software is recorded and a processor together with necessary hardware devices such as an interface.

Embodiments of the present disclosure are described below with reference to the drawings. Each of the embodiments described below illustrates a general or specific example. Numerical values, shapes, materials, constituent elements, ways in which the constituent elements are arranged and connected, steps, the order of steps, and the like in the embodiments below are examples and do not limit the present disclosure. Various aspects described herein can be combined as long as no contradiction occurs. Among constituent elements in the embodiments described below, constituent elements that are not described in independent claims that indicate the highest concepts are described as optional constituent elements.

Embodiment

The configuration of the present embodiment is the same as that of the examined example except for patterning of light shielding regions 9A and detection regions (detectors) and a combination thereof. Constituent elements that are identical to those in the examined example are given identical reference signs, and overlapping description thereof is omitted.

Figure 8A:
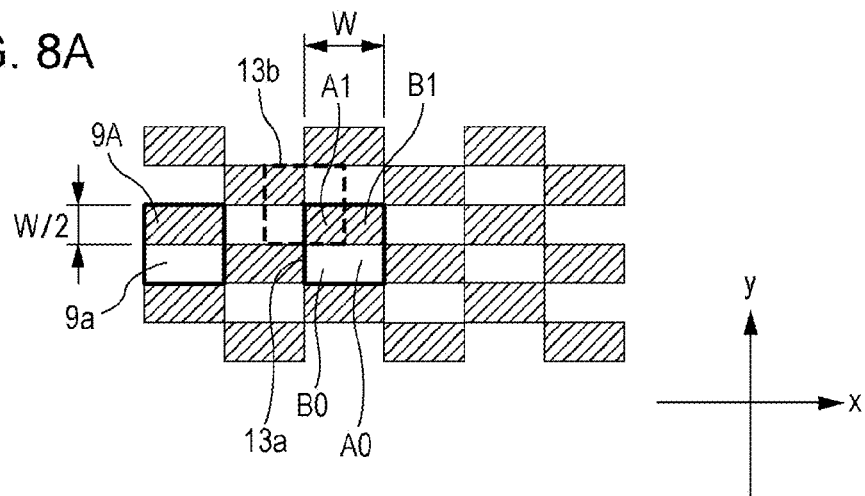
FIG. 8A is a plan view illustrating an arrangement pattern of light transmitting regions and light shielding regions in an embodiment of the present disclosure.
Figure 8B:
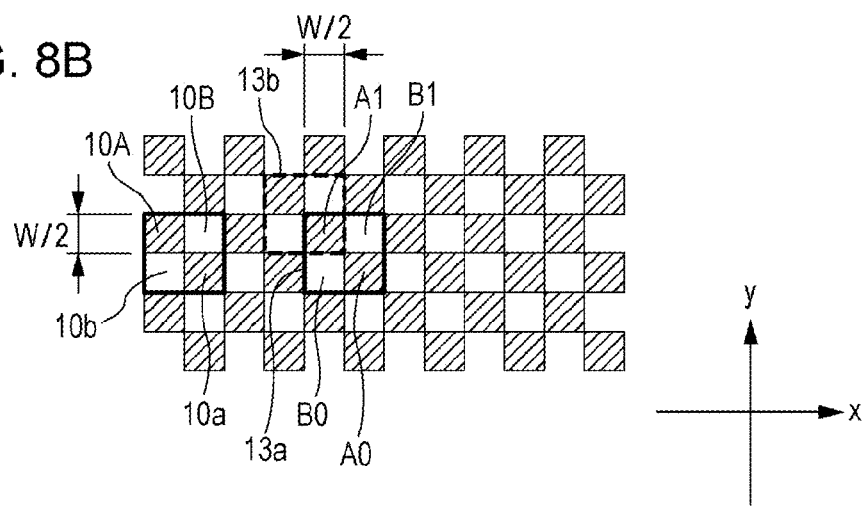
FIG. 8B is a plan view illustrating arrangement of a plurality of detectors directly below the light transmitting regions and the light shielding regions in the embodiment of the present disclosure.
Figure 8C:
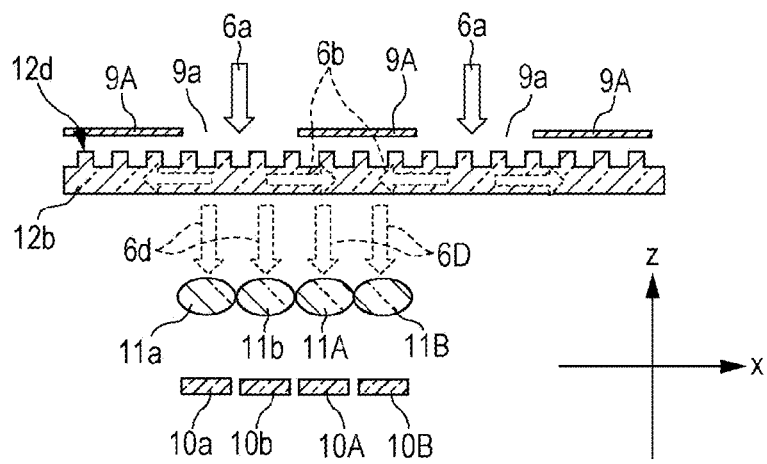
FIG. 8C is a cross-sectional view of a cross section parallel with the xz plane and schematically illustrates a positional relationship between the light transmitting regions and the light shielding regions and the detectors in the embodiment of the present disclosure.

FIG. 8A is a plan view illustrating an arrangement pattern of light transmitting regions 9a and light shielding regions 9A in the present embodiment. FIG. 8B is a plan view illustrating arrangement of a plurality of detectors 10a, 10b, 10A, and 10B located directly below the light transmitting regions 9a and the light shielding regions 9A. FIG. 8C is a cross sectional view illustrating a cross section parallel with an xz plane and schematically illustrates a positional relationship between the light transmitting regions 9a and the light shielding regions 9A and the detectors 10a, 10b, 10A, and 10B. The detectors 10a and 10b are located directly below the light transmitting regions 9a, and the detectors 10A and 10B are located directly below the light shielding regions 9A. In the light detection device according to the present embodiment, a grating 12d includes a plurality of grooves each of which extends in a first direction. In plan view, the length of each of the light transmitting regions 9a in the first direction is shorter than that of each of the light transmitting regions 9a in a second direction perpendicular to the first direction, and the length of each of the light shielding regions 9A in the first direction is shorter than that of each of the light shielding regions 9A in the second direction. Each of the light transmitting regions 9a and the light shielding regions 9A has a size of W×W/2, which is smaller in the y direction than the size (W×W) in the examined example. Each of the detectors 10a, 10b, 10A, and 10B has a size of W/2×W/2, which is smaller in the x direction and the y direction than the size (W×W) in the examined example. Although only four detectors 10a, 10b, 10A, and 10B among the plurality of detectors are illustrated, a large number of detectors 10 are actually arranged in a two-dimensional manner along a surface (main surface) parallel with an xy plane.

Assume that a detection region directly below a right half of the light transmitting region 9a is A0, a detection region directly below a left half of the light transmitting region 9a is B0, a detection region directly below a left half of the light shielding region 9A is A1, and a detection region directly below a right half of the light shielding region 9A is B1, as illustrated in FIGS. 8A and 8B. A pixel region 13a indicated by the solid line in FIGS. 8A and 8B includes a single detection region A0, a single detection region B0, a single detection region A1, and a single detection region B1, and a pixel region 13b indicated by the broken line in FIGS. 8A and 8B also includes a single detection region A0, a single detection region B0, a single detection region A1, and a single detection region B1. A light amount of light that is not turned into guided light is detected by the regions A0 and B0, and a light amount of light that is turned into guided light is detected by the regions A1 and B1. Although a light amount of light that is turned into guided light cannot be detected by the regions A0 and B0, the light amount can be approximated by an average of light amounts detected by adjacent regions A1 and B1. Similarly, although a light amount of light that is not turned into guided light cannot be detected by the regions A1 and B1, the light amount can be approximated by an average of light amounts detected by adjacent regions A0 and B0. That is, an average of light amounts detected by detection positions directly below regions (pixels) adjacent in the x direction and/or the y direction to a certain region (the light transmitting region 9a or the light shielding region 9A) is defined, and this definition is applied to all regions. This makes it possible to define a detected amount of light that is not turned into guided light and a detected amount of light that is turned into guided light in all of the detection regions (detectors) that constitute the light detector 10.

A light detection system according to the present embodiment has the configuration illustrated in FIG. 1A, as in the examined example. Specifically, the light detection system 100 includes a light source 2, a light collecting lens 7, a light detection device 13, a control circuit 1, and an arithmetic circuit 14. The light detection device 13 includes a light detector 10 including a plurality of first detectors and a plurality of second detectors disposed along a main surface (imaging surface), a light coupling layer 12 disposed on or above the light detector 10, and a light shielding film 9 disposed on or above the light coupling layer 12, as in the configuration illustrated in FIG. 2A. The expression "on or above" means that one element is located on an upper side of another element based on the arrangement illustrated in the drawings of the present disclosure and encompasses a state where one element is located on an upper side of another element in contact with the other element and a state where one element is located on an upper side of another element without contact with the other element (i.e., with another element or layer interposed therebetween). The light coupling layer 12 includes a first low-refractive-index layer 12c, a first high-refractive-index layer 12b that is disposed on the first low-refractive-index layer 12c and includes a first grating 12d, and a second low-refractive-index layer 12a disposed on the first high-refractive-index layer 12b. The first high-refractive-index layer 12b has a higher refractive index than the first low-refractive-index layer 12c and the second low-refractive-index layer 12a. In the present embodiment, the light coupling layer 12 further includes a third low-refractive-index layer disposed between the first low-refractive-index layer 12c and the light detector 10 and a second high-refractive-index layer that is disposed between the third low-refractive-index layer and the first low-refractive-index layer 12c and includes a second grating. The second high-refractive-index layer has a higher refractive index than the first low-refractive-index layer 12c and the third low-refractive-index layer. The light coupling layer 12 has a plurality of combinations of two low-refractive-index layers and a high-refractive-index layer sandwiched therebetween and having a grating in addition to the aforementioned one. The light coupling layer 12 functions as an optical waveguide due to such a structure in which gratings are stacked. Note that the number of combinations of two low-refractive-index layers and a high-refractive-index layer sandwiched therebetween and having a grating is not limited in particular, and it is only necessary that at least one combination be provided.

The light shielding film 9 includes at least one light transmitting region 9a and at least one light shielding region 9A adjacent to the at least one light transmitting region 9a. In the present embodiment, the light shielding film 9 includes a plurality of light transmitting regions 9a arranged in a checkered pattern and a plurality of light shielding regions 9A disposed therebetween, as illustrated in FIG. 8A. The way in which the plurality of light shielding regions are arranged is not limited to a checkered pattern and can be, for example, a striped shape in plan view.

Each of the light transmitting regions 9a faces two or more first detectors 10a and 10b included in the plurality of first detectors. Each of the light shielding regions 9A faces two or more second detectors 10A and 10B included in the plurality of second detectors.

The arithmetic circuit 14 defines a detected amount of light that is not turned into guided light and a detected amount of light that is turned into guided light in all of the detectors (light detection cells) included in the light detector 10 as described above. The arithmetic circuit 14 performs arithmetic processing such as generating an image by allocating a value calculated for each detector, such as a value of a ratio of these light amounts or a value obtained by dividing one of these light amounts by the sum of the two light amounts, to a pixel corresponding to the detector. In the present embodiment, even if the pixel regions are shifted in any way in the xy plane by an amount corresponding to the width W/2, each of the pixel regions includes a single detection region A0, a single detection region B0, a single detection region A1, and a single detection region B1 although a positional relationship thereof may change. Since detectors directly below the light shielding region 9A and detectors directly below the light transmitting region 9a are included in the same number in each pixel region as described in the examined example, detected light amounts are correctly subjected to an interpolation process. If the resolution is determined by a pixel size, the resolution is W×W. In the present embodiment, the same interpolation process applies even if the pixels are moved in any direction within the xy plane by the width W/2. This improves the resolution after the interpolation process to W/2×W/2. That is, in the present embodiment, it is possible to markedly improve the resolution of an image while keeping the same effect as the examined example by changing the patterning of the light shielding regions 9A and the detection regions and a combination thereof.

The configuration of the present embodiment may be combined with the time division detection method (second conventional example) described with reference to FIGS. 12A and 12B. This makes it possible to analyze a signal that is taken in in a time division manner in a coherence state. It is therefore possible to analyze scattering in a subject in more detail.

In the present embodiment, a single light transmitting region 9a faces the two detectors 10a and 10b, and a single light shielding region 9A faces the two detectors 10A and 10B. However, the present disclosure is not limited to such an embodiment. For example, each of the light shielding regions 9A and/or each of the light transmitting regions 9a may face three or more detectors. This can be generalized as follows: it is only necessary that a single light transmitting region 9a face two or more detectors, and a single light shielding region 9A face two or more detectors. All of the processing described in the examined example can be applied by using the sum of outputs from n former detectors and the sum of outputs of n latter detectors instead of an output of a single detector in the examined example. For example, the arithmetic circuit 14 may output at least one signal selected from a group consisting of (1) a signal indicative of a ratio P1/P0 of a second light amount P1 to a first light amount P0, (2) a signal indicative of a ratio P0/(P0+P1) of the first light amount P0 to the sum of the first light amount P0 and the second light amount P1, and (3) a signal indicative of a ratio P1/(P0+P1) of the second light amount P1 to the sum of the first light amount P0 and the second light amount P1 where the first light amount P0 is the sum of light amounts detected by two or more first detectors that face the light transmitting region 9a and the second light amount P1 is the sum of light amounts detected by two or more second detectors that face the light shielding region 9A. Information on a subject (target) can be obtained on the basis of any of these detection signals, as described with reference to FIG. 5B. The arithmetic circuit 14 finds the degree of coherence from the detection signal by referring to a function or a table that is stored in advance in a storage medium such as a memory and that defines a relationship between the detection signal and the degree of coherence (e.g., a random rate) (see FIG. 5B).

There is correlation between the degree of coherence and the structure of the target. For example, in a case where the degree of coherence of light arriving from a certain position is high, presence of a target having a smooth surface and occurrence of reflection on the surface at this position can be estimated. Meanwhile, in a case where the degree of coherence of light arriving from a certain position is low, occurrence of scattering in a target or occurrence of reflection on an irregular surface at this position can be estimated. The arithmetic circuit 14 performs such generation of a signal and estimation of a structure of a target, for example, for each pair of adjacent light transmitting and light shielding regions. This makes it possible to obtain information on the target over a wide region.

In an aspect in which the control circuit 1 hanges a coherence length of light emitted from the light source 2, the arithmetic circuit 14 may generate any of the aforementioned detection signals for each coherence length of light changed by the control circuit 1. This makes it possible to know details of scattering in a subject while using a coherence length as a parameter, as described with reference to FIGS. 7E and 7F. The arithmetic circuit 14 may generate image information in which a region where a value of a generated signal is equal to or larger than a predetermined threshold value and a region where the value of the signal is smaller than the threshold value are distinguished from each other, for example, as illustrated in FIGS. 7E and 7F. This can visualize an inner structure of the subject.

What is claimed is:

1. A light detection device comprising:
    a light detector that has a main surface and includes first detectors and second detectors that are both disposed along the main surface;
    a light coupling layer disposed on or above the light detector, the light coupling layer including
        a first low-refractive-index layer,
        a first high-refractive-index layer that is disposed on the first low-refractive-index layer and includes a first grating, and
        a second low-refractive-index layer that is disposed on the first high-refractive-index layer,
        the first high-refractive-index layer having a higher refractive index than the first low-refractive-index layer and the second low-refractive-index layer; and
    a light shielding film that is disposed on the light coupling layer and includes a light transmitting region and a light shielding region adjacent to the light transmitting region, wherein:
    the light transmitting region faces two or more first detectors included in the first detectors, and
    the light shielding region faces two or more second detectors included in the second detectors.

2. The light detection device according to claim 1, wherein
    a plurality of light transmitting regions are provided in the light shielding film, each of the plurality of light transmitting regions being the light transmitting region; and
    a plurality of light shielding regions are provided in the light shielding film, each of the plurality of light shielding regions being the light shielding region.

3. The light detection device according to claim 1, wherein the light detector further includes
    first microlenses each of which is disposed between a corresponding one of the first detectors and the light coupling layer; and
    second microlenses each of which is disposed between a corresponding one of the second detectors and the light coupling layer.

4. The light detection device according to claim 1, wherein
    the light coupling layer further includes
        a third low-refractive-index layer disposed between the first low-refractive-index layer and the light detector, and
        a second high-refractive-index layer disposed between the third low-refractive-index layer and the first low-refractive-index layer and including a second grating; and
    the second high-refractive-index layer has a higher refractive index than the first low-refractive-index layer and the third low-refractive-index layer.

5. The light detection device according to claim 1, wherein
    one of two surfaces of the light shielding region that is closer to the light coupling layer has light reflectivity.

6. The light detection device according to claim 1, wherein
    the first grating includes a plurality of grooves extending in a first direction;
    a length of the light transmitting region in the first direction is shorter than a length of the light transmitting region in a second direction perpendicular to the first direction in plan view; and
    a length of the light shielding region in the first direction is shorter than a length of the light shielding region in the second direction in plan view.

7. A light detection system comprising:
    a light detection device; and
    an arithmetic circuit connected to the light detection device, wherein:
    the light detection device includes
        a light detector that has a main surface and includes first detectors and second detectors that are both disposed along the main surface;
        a light coupling layer disposed on or above the light detector, the light coupling layer including
            a first low-refractive-index layer,
            a first high-refractive-index layer that is disposed on the first low-refractive-index layer and includes a first grating, and
            a second low-refractive-index layer that is disposed on the first high-refractive-index layer,
            the first high-refractive-index layer having a higher refractive index than the first low-refractive-index layer and the second low-refractive-index layer; and
        a light shielding film that is disposed on the light coupling layer and includes a light transmitting region and a light shielding region adjacent to the light transmitting region,
    the light transmitting region facing two or more first detectors included in the first detectors,
    the light shielding region facing two or more second detectors included in the second detectors, and
    the arithmetic circuit, in operation, outputs at least one signal selected from the group consisting of (1) a first signal indicating a ratio of a second light amount to a first light amount, (2) a second signal indicating a ratio of the first light amount to a sum of the first light amount and the second light amount, and (3) a third signal indicating a ratio of the second light amount to the sum of the first light amount and the second light amount, the first light amount being a sum of light amounts detected by the two or more first detectors, and the second light amount being a sum of light amounts detected by the two or more second detectors.

8. The light detection system according to claim 7, wherein
a plurality of light transmitting regions are provided in the light shielding film, each of the plurality of light transmitting regions being the light transmitting region;
a plurality of light shielding regions are provided in the light shielding film, each of the plurality of light shielding regions being the light shielding region; and
the arithmetic circuit, in operation, outputs the at least one signal for each pair of adjacent light transmitting region and light shielding region among the plurality of light transmitting regions and the plurality of light shielding regions.

9. The light detection system according to claim 8, wherein
the arithmetic circuit, in operation, generates image information representing the pair in which a value of the at least one signal is equal to or larger than a threshold value and the pair in which the value of the at least one signal is smaller than the threshold value.

10. The light detection system according to claim 7, further comprising a light source that, in operation, emits light of a wavelength band, wherein
the light detection device further includes a bandpass filter that is disposed on or above the light coupling layer and selectively transmits light of the wavelength band.

11. The light detection system according to claim 7, further comprising:
a light source; and
a control circuit that, in operation, controls the light source, wherein
the control circuit, in operation, changes a coherence length of light emitted from the light source.

12. The light detection system according to claim 11, wherein
the arithmetic circuit, in operation, outputs the at least one signal for each coherence length of the light changed by the control circuit.

* * * * *